(12) United States Patent
Goldstein

(10) Patent No.: US 9,523,479 B2
(45) Date of Patent: Dec. 20, 2016

(54) LED LENS

(71) Applicant: Cree, Inc., Durham, NC (US)

(72) Inventor: Corey Goldstein, Kenosha, WI (US)

(73) Assignee: Cree, Inc., Durham, NC (US)

( * ) Notice: Subject to any disclaimer, the term of this patent is extended or adjusted under 35 U.S.C. 154(b) by 250 days.

(21) Appl. No.: 14/147,268

(22) Filed: Jan. 3, 2014

(65) Prior Publication Data

US 2015/0192267 A1    Jul. 9, 2015

(51) Int. Cl.
| | |
|---|---|
| *F21V 5/00* | (2015.01) |
| *F21V 5/04* | (2006.01) |
| *F21V 7/00* | (2006.01) |
| *G02B 3/00* | (2006.01) |
| *F21V 5/08* | (2006.01) |
| *H01L 33/58* | (2010.01) |
| *F21Y 101/00* | (2016.01) |

(52) U.S. Cl.
CPC ............... *F21V 5/04* (2013.01); *F21V 7/0091* (2013.01); *G02B 3/00* (2013.01); *F21V 5/08* (2013.01); *F21Y 2101/00* (2013.01); *F21Y 2105/10* (2016.08); *F21Y 2113/13* (2016.08); *F21Y 2115/10* (2016.08); *H01L 33/58* (2013.01)

(58) Field of Classification Search
CPC ........ F21S 48/24; F21S 48/215; F21S 48/236; F21V 5/04; F21V 7/0091; G02B 19/0028; G02B 19/0061
See application file for complete search history.

(56) References Cited

U.S. PATENT DOCUMENTS

| | | |
|---|---|---|
| 1,404,004 A | 1/1922 | Benford |
| 1,535,486 A | 4/1925 | Lundy |
| 2,007,033 A | 7/1935 | Williams |
| 2,212,876 A | 8/1940 | Chauvet |
| 2,254,961 A | 9/1941 | Harris |
| 2,802,097 A | 9/1952 | Franck |

(Continued)

FOREIGN PATENT DOCUMENTS

| | | |
|---|---|---|
| EP | 1107210 A2 | 6/2001 |
| GB | 2282700 | 4/1995 |

(Continued)

OTHER PUBLICATIONS

Future Lighting Solutions "the 6 Steps to LED Lighting Success." brochure. Date: undated. 6 pages.

*Primary Examiner* — Andrew Coughlin
*Assistant Examiner* — Meghan Ulanday
(74) *Attorney, Agent, or Firm* — Jansson Munger McKinley & Kirby Ltd.

(57) ABSTRACT

A lens for distribution of light from a light emitter having an emitter axis. The lens includes an outer surface and a total internal reflection (TIR) surface positioned outwardly of and around the emitter such that light received by the TIR surface is totally internally reflected toward the outer surface. The TIR surface has at least one recessed region extending away from the light emitter, thereby to increase amount of TIR and facilitate lateral diffusion of highest-intensity light in the middle of the light distribution. The lens may further include a base surface adjacent the emitter and an inner surface defining an inner cavity about the emitter axis. In such embodiments, the TIR is positioned and configured for total internal reflection of light received from the inner surface.

47 Claims, 23 Drawing Sheets

(56) References Cited

U.S. PATENT DOCUMENTS

| | | | |
|---|---|---|---|
| 2,908,197 A | 10/1959 | Wells et al. | |
| 3,497,687 A | 2/1970 | Hermann | |
| 3,625,615 A | 12/1971 | Wilson | |
| 4,186,995 A | 2/1980 | Schumacher | |
| 4,254,453 A | 3/1981 | Mouyard et al. | |
| 4,336,580 A | 6/1982 | Mouyard et al. | |
| 4,345,308 A | 8/1982 | Mouyard et al. | |
| 4,650,998 A | 3/1987 | Martin | |
| 4,767,172 A | 8/1988 | Nichols et al. | |
| 4,845,600 A | 7/1989 | Matsumura et al. | |
| 4,862,330 A | 8/1989 | Machida et al. | |
| 4,935,665 A | 6/1990 | Murata | |
| 4,941,072 A | 7/1990 | Yasumoto et al. | |
| 5,001,609 A | 3/1991 | Gardner et al. | |
| 5,013,144 A | 5/1991 | Silverglate et al. | |
| 5,014,165 A | 5/1991 | Naganawa | |
| 5,062,027 A | 10/1991 | Machida et al. | |
| 5,127,728 A | 7/1992 | Warren et al. | |
| 5,140,220 A | 8/1992 | Hasegawa | |
| 5,174,649 A | 12/1992 | Alston | |
| RE34,254 E | 5/1993 | Dragoon | |
| 5,289,082 A | 2/1994 | Komoto | |
| 5,302,778 A | 4/1994 | Maurinus | |
| 5,349,504 A | 9/1994 | Simms et al. | |
| 5,592,578 A | 1/1997 | Ruh | |
| 5,784,209 A | 7/1998 | Manabe | |
| 5,813,743 A | 9/1998 | Naka | |
| 5,813,752 A | 9/1998 | Singer et al. | |
| 5,865,529 A | 2/1999 | Yan | |
| 5,894,195 A | 4/1999 | McDermott | |
| 5,894,196 A | 4/1999 | McDermott | |
| 5,898,267 A | 4/1999 | McDermott | |
| 5,924,788 A | 7/1999 | Parkyn, Jr. | |
| 5,939,996 A | 8/1999 | Kniveton et al. | |
| 5,995,291 A | 11/1999 | Togino | |
| 6,097,549 A | 8/2000 | Jenkins et al. | |
| 6,229,160 B1 | 5/2001 | Krames et al. | |
| 6,244,727 B1 | 6/2001 | Ryan, Jr. et al. | |
| 6,250,787 B1 | 6/2001 | Matubara | |
| 6,273,596 B1 | 8/2001 | Parkyn, Jr. | |
| 6,274,924 B1 | 8/2001 | Carey et al. | |
| 6,283,613 B1 | 9/2001 | Schaffer | |
| 6,296,376 B1 | 10/2001 | Kondo et al. | |
| 6,323,063 B2 | 11/2001 | Krames et al. | |
| 6,361,190 B1 | 3/2002 | McDermott | |
| 6,361,192 B1 | 3/2002 | Fussell et al. | |
| 6,443,594 B1 | 9/2002 | Marshall et al. | |
| 6,473,238 B1 | 10/2002 | Daniell | |
| 6,481,130 B1 | 11/2002 | Wu | |
| 6,498,355 B1 | 12/2002 | Harrah et al. | |
| 6,502,956 B1 | 1/2003 | Wu | |
| 6,504,301 B1 | 1/2003 | Lowery | |
| 6,541,800 B2 | 4/2003 | Barnett et al. | |
| 6,547,423 B2 | 4/2003 | Marshall et al. | |
| 6,550,940 B2 | 4/2003 | Kamiya et al. | |
| 6,554,451 B1 | 4/2003 | Keuper | |
| 6,560,038 B1 | 5/2003 | Parkyn, Jr. et al. | |
| 6,570,190 B2 | 5/2003 | Krames et al. | |
| 6,598,998 B2 | 7/2003 | West et al. | |
| 6,601,962 B1 | 8/2003 | Ehara et al. | |
| 6,607,286 B2 | 8/2003 | West et al. | |
| 6,616,299 B2 | 9/2003 | Martineau | |
| 6,637,921 B2 | 10/2003 | Coushaine | |
| 6,679,621 B2 | 1/2004 | West et al. | |
| 6,682,211 B2 | 1/2004 | English et al. | |
| 6,721,101 B2 | 4/2004 | Daniell | |
| 6,730,940 B1 | 5/2004 | Steranka et al. | |
| 6,808,293 B2 | 10/2004 | Watanabe et al. | |
| 6,837,605 B2 | 1/2005 | Reill | |
| 6,846,101 B2 | 1/2005 | Coushaine | |
| 6,851,835 B2 | 2/2005 | Smith et al. | |
| 6,896,381 B2 | 5/2005 | Benitez et al. | |
| 6,903,376 B2 | 6/2005 | Shen et al. | |
| 6,918,677 B2 | 7/2005 | Shipman | |
| 6,924,943 B2 * | 8/2005 | Minano | G02B 3/08 359/720 |
| 6,929,384 B2 | 8/2005 | Watanabe et al. | |
| 6,948,840 B2 | 9/2005 | Grenda et al. | |
| 6,955,451 B2 | 10/2005 | Coushaine et al. | |
| 6,987,613 B2 | 1/2006 | Pocius et al. | |
| 6,991,355 B1 | 1/2006 | Coushaine et al. | |
| 6,995,402 B2 | 2/2006 | Ludowise et al. | |
| 7,009,213 B2 | 3/2006 | Camras et al. | |
| 7,021,797 B2 | 4/2006 | Minano et al. | |
| 7,042,021 B2 | 5/2006 | Isoda | |
| 7,053,419 B1 | 5/2006 | Camras et al. | |
| 7,063,441 B2 | 6/2006 | Kramer et al. | |
| 7,063,450 B2 | 6/2006 | Ehara et al. | |
| 7,064,355 B2 | 6/2006 | Camras et al. | |
| 7,080,932 B2 | 7/2006 | Keuper | |
| 7,083,313 B2 | 8/2006 | Smith | |
| 7,106,523 B2 | 9/2006 | McLean et al. | |
| 7,111,972 B2 | 9/2006 | Coushaine et al. | |
| 7,114,838 B2 | 10/2006 | Wu | |
| 7,118,236 B2 | 10/2006 | Hahm et al. | |
| 7,118,262 B2 | 10/2006 | Negley | |
| 7,121,691 B2 | 10/2006 | Coushaine et al. | |
| 7,125,143 B2 | 10/2006 | Hacker | |
| 7,125,160 B2 | 10/2006 | Wong et al. | |
| 7,150,553 B2 | 12/2006 | English et al. | |
| 7,153,000 B2 | 12/2006 | Park et al. | |
| 7,153,002 B2 | 12/2006 | Kim et al. | |
| 7,172,324 B2 | 2/2007 | Wu et al. | |
| 7,181,378 B2 | 2/2007 | Benitez et al. | |
| 7,182,497 B2 | 2/2007 | Lee et al. | |
| 7,213,945 B2 | 5/2007 | Yoneda et al. | |
| 7,246,923 B2 | 7/2007 | Conner | |
| 7,246,931 B2 | 7/2007 | Hsieh et al. | |
| 7,254,309 B1 | 8/2007 | Chou et al. | |
| 7,329,029 B2 | 2/2008 | Chaves et al. | |
| 7,348,723 B2 | 3/2008 | Yamaguchi et al. | |
| 7,352,011 B2 | 4/2008 | Smits et al. | |
| 7,410,275 B2 | 8/2008 | Sommers et al. | |
| 7,411,742 B1 | 8/2008 | Kim et al. | |
| 7,549,769 B2 | 6/2009 | Kim et al. | |
| 7,618,163 B2 | 11/2009 | Wilcox | |
| 7,674,018 B2 | 3/2010 | Holder et al. | |
| 7,766,509 B2 | 8/2010 | Laporte | |
| 7,854,536 B2 | 12/2010 | Holder et al. | |
| 7,866,837 B2 | 1/2011 | Ho | |
| 7,901,098 B2 | 3/2011 | Saitoh et al. | |
| 7,922,369 B2 | 4/2011 | Condon et al. | |
| 7,942,558 B2 | 5/2011 | Zweig et al. | |
| 8,348,475 B2 | 1/2013 | Wilcox et al. | |
| 8,388,193 B2 | 3/2013 | Wilcox et al. | |
| 2004/0037076 A1 | 2/2004 | Katoh et al. | |
| 2004/0114355 A1 | 6/2004 | Rizkin | |
| 2004/0156209 A1 | 8/2004 | Ishida | |
| 2004/0207999 A1 | 10/2004 | Suehiro et al. | |
| 2004/0212291 A1 | 10/2004 | Keuper | |
| 2005/0073849 A1 | 4/2005 | Rhoads et al. | |
| 2005/0083699 A1 | 4/2005 | Rhoads et al. | |
| 2005/0179041 A1 | 8/2005 | Harbers et al. | |
| 2005/0205878 A1 | 9/2005 | Kan | |
| 2005/0224826 A1 | 10/2005 | Keuper et al. | |
| 2005/0281047 A1 | 12/2005 | Coushaine et al. | |
| 2006/0013000 A1 | 1/2006 | Coushaine et al. | |
| 2006/0013002 A1 | 1/2006 | Coushaine et al. | |
| 2006/0039143 A1 | 2/2006 | Katoh et al. | |
| 2006/0067640 A1 | 3/2006 | Hsieh et al. | |
| 2006/0082999 A1 | 4/2006 | Klein | |
| 2006/0083000 A1 | 4/2006 | Yoon et al. | |
| 2006/0105482 A1 | 5/2006 | Alferink et al. | |
| 2006/0181902 A1 | 8/2006 | Tamura et al. | |
| 2006/0186431 A1 | 8/2006 | Miki et al. | |
| 2006/0198144 A1 | 9/2006 | Miyairi et al. | |
| 2007/0019416 A1 | 1/2007 | Han et al. | |
| 2007/0058369 A1 | 3/2007 | Parkyn et al. | |
| 2007/0201225 A1 | 8/2007 | Holder et al. | |
| 2008/0101063 A1 | 5/2008 | Koike et al. | |
| 2008/0205061 A1 | 8/2008 | Holder et al. | |
| 2008/0239722 A1 | 10/2008 | Wilcox | |
| 2009/0086498 A1 | 4/2009 | Condon et al. | |

(56) References Cited

U.S. PATENT DOCUMENTS

| | | |
|---|---|---|
| 2010/0014286 A1 | 1/2010 | Yoneda et al. |
| 2010/0039810 A1 | 2/2010 | Holder et al. |
| 2010/0073927 A1 | 3/2010 | Lewin et al. |
| 2010/0085763 A1 | 4/2010 | Aguglia |
| 2010/0085764 A1 | 4/2010 | Chuang |
| 2010/0110695 A1 | 5/2010 | Nakamura |
| 2010/0128488 A1 | 5/2010 | Marcoux |
| 2010/0135028 A1 | 6/2010 | Kokubo |
| 2011/0026247 A1 | 2/2011 | Zhang |
| 2011/0110098 A1 | 5/2011 | Fu |
| 2011/0164425 A1 | 7/2011 | Chen |
| 2012/0051047 A1 | 3/2012 | Lu |
| 2012/0299030 A1* | 11/2012 | Brick .................. H01L 33/54 257/88 |
| 2014/0022797 A1 | 1/2014 | Wilcox et al. |

FOREIGN PATENT DOCUMENTS

| | | |
|---|---|---|
| JP | 60199746 | 10/1985 |
| JP | 61160328 | 7/1986 |
| JP | 61185980 | 8/1986 |
| JP | 61214485 | 9/1986 |
| JP | 8264839 | 10/1996 |
| WO | WO9950596 | 10/1999 |
| WO | WO0024062 | 4/2000 |
| WO | WO2006111805 A1 | 10/2006 |
| WO | WO2007018927 A2 | 2/2007 |
| WO | WO2008144672 A1 | 11/2008 |

\* cited by examiner

LED LENS

FIELD OF THE INVENTION

This invention relates generally to the field of LED lighting apparatus and, more particularly, to the field of LED-based optical systems for use in LED lighting fixtures for which there are particular light-distribution requirements, such as what is sometimes referred to as preferential-side light distribution—for roadway light fixtures and the like.

BACKGROUND OF THE INVENTION

In recent years, the use of light-emitting diodes (LEDs) for various common lighting purposes has increased, and this trend has accelerated as advances have been made in LEDs, LED arrays, and specific components. Indeed, lighting applications which previously had typically been served by fixtures using what are known as high-intensity discharge (HID) lamps are now being served by LED lighting fixtures. Such lighting applications include, among a good many others, roadway lighting, factory lighting, parking lot lighting, and commercial building lighting.

In many of such products, achieving high levels of illumination over large areas with specific light-distribution requirements is particularly important. One pertinent example is fixtures for roadway lighting, an application in which the fixtures are generally placed along roadway edges while light distribution is desired along a significant portion of roadway length and, of course, on the roadway itself—generally to the exclusion of significant light off the roadway.

Providing roadway light from light fixtures along the roadway may be referred to as "preferential-side" illumination. In such situations it is desirable to minimize the use of large complex reflectors and/or varying orientations of multiple light sources to achieve desired illumination patterns. Achieving preferential-side illumination, or other desired illumination patterns, by means of LED-based optical systems, particularly without resorting to large complex reflectors or other complex means is highly desirable.

SUMMARY OF THE INVENTION

The present invention is a lens for distribution of light from a light emitter having an emitter axis. The lens has an outer surface and a total internal reflection (TIR) surface positioned outwardly of and around the emitter such that light received by the TIR surface is totally internally reflected toward the outer surface. The TIR surface includes at least one recessed region extending away from the light emitter, thereby to increase amount of TIR and facilitate lateral diffusion of highest-intensity light in the middle of the light distribution.

In certain embodiments, the TIR surface is substantially cross-sectionally convex. In some of such embodiments, the TIR surface comprises at least two cross-sectionally convex surface portions with the recessed region therebetween.

The presence of the recessed region results in decreased radii of curvature of the convex portions as compared to the curvature of the entire TIR surface. Due to the increased curvature, TIR surface reflects light at greater angles which provides a wider lateral light distribution and beneficial lateral diffusion of highest-intensity light in the middle of the light distribution. This facilitates uniformity of the resulting light pattern. Also, the critical TIR angle is smaller at the surface with the greater curvature which broadens the range of angles for reflection of light that reaches the TIR surface. Consequently, more light that reaches TIR surface is usefully reflected instead of passing through the TIR surface, thereby facilitating efficiency of the lens.

The recessed region may be substantially cross-sectionally smoothly concave and smoothly adjoin adjacent convex portions of the TIR surface.

In certain embodiments, the lens is configured for distributing light from the light emitter predominantly toward a preferential side. In such embodiments, the TIR surface is centered substantially on the non-preferential side to redirect light therefrom toward the preferential side. In some versions, the TIR surface spans an angle in the range 90-180° around the emitter axis. The TIR surface may span about 140° around the emitter axis.

In some of such embodiments, the lens further includes a refracting inner surface configured for refracting light from the light emitter predominantly toward a preferential side. The inner surface defines an inner cavity about the emitter axis. The refracting inner surface may have front and back sectors. The front sector is centered on the preferential side and refracts emitter light predominantly toward the outer surface. The back sector is centered on the non-preferential side radially opposite the preferential side and has a back-sector surface configuration which differs from the surface configuration of the front sector.

In some embodiments, the lens has a base surface adjacent the emitter and forming an opening about the emitter. In such embodiments, the inner surface extends from the opening.

In certain embodiments, the TIR surface partially bounds a secondary cavity which is offset from the inner cavity. The secondary cavity is offset from the inner cavity with an intermediate surface therebetween. The intermediate surface including front and rear edges with a pair of side edges therebetween, the TIR surface extending from the rear edge of the intermediate surface. The rear edge of the intermediate surface may be shaped by at least two convex edge portions each extending from the respective side edge toward a front-to-rear centerline and inwardly toward the emitter axis, thereby forming a recessed edge portion on the centerline. The recessed edge portion may be substantially smoothly concave and smoothly adjoins adjacent convex edge portions.

In certain embodiments, the convex edge portions define two central tangent lines transverse to the centerline. The angle between the central tangent lines is less than 180°. In some of such embodiments, the convex edge portions define two side tangent lines transverse to the centerline. In certain examples, the angle between the side tangent lines is less than the angle between the central tangent lines.

In some embodiments, the TIR surface terminates at a distal edge of substantially continuous convex configuration. The secondary cavity may be further partially bounded by an axially-remote surface extending from the base surface toward the TIR surface and offset therefrom by an end surface which extends from the distal edge of the TIR surface to an axially-remote surface.

The intermediate surface may be substantially orthogonal to the emitter axis.

In certain embodiments, the back sector of the inner surface extends from the front edge of the intermediate surface. In some of such embodiments, the front edge of the intermediate surface is shaped by at least two convex front-edge portions each extending from the respective side edge toward the front-to-rear centerline and inwardly toward the emitter axis, thereby forming a recessed front-edge portion on the centerline.

In certain embodiments, the convex front-edge portions define two front-edge central tangent lines transverse to the centerline, the angle between the front-edge central tangent lines being less than 180°. In some of such embodiments, the convex edge portions define two front-edge side tangent lines transverse to the centerline. In certain versions, the angle between the front-edge side tangent lines is less than the angle between the front-edge central tangent lines.

In some embodiments, the front edge of the intermediate surface is substantially equidistant from the rear edge at positions along radii from the emitter axis.

The outer surface may be configured for refracting emitter light predominantly toward the preferential side. In some versions, the outer surface has a non-convex region substantially over the TIR surface configured to further refract light received from the TIR surface.

The lens may further include an outward flange extending from the outer surface away from the axis.

Another aspect of the present invention is a light fixture including a heat-sink structure having a mounting surface. A circuit board is on the mounting surface and supports a plurality of light emitters spaced thereon. An optical member is positioned over the circuit board and has a plurality of the lenses each in alignment with a corresponding one of the emitters.

The light emitter may be an LED emitter which may include a single LED or a closely-spaced group of LEDs mounted either directly on the board (e.g., a circuit board) or in the form of an LED package with the LED(s) on a submount on the board. The LED emitter may include what is commonly referred to as a primary lens over the LED(s). In some embodiments, the inventive lens is a so-called secondary lens placed over the primary lens. In some other embodiments, the lens according to the present invention may be the primary lens directly over the LED(s).

The term "transverse," as used herein in reference to the tangent lines with respect to the emitter axis, means that the tangent lines intersect the emitter axis.

As used herein in referring to portions of the devices of this invention, the terms "upward," "upwardly," "upper," "downward," "downwardly," "lower," "upper," "top," "bottom," "over" and other like terms are used in order to facilitate description of the relationship between parts of the invention and do not limit the invention to any particular orientation.

In descriptions of this invention, including in the claims below, the terms "comprising," "including" and "having" (each in their various forms) and the term "with" are each to be understood as being open-ended, rather than limiting, terms.

DETAILED DESCRIPTION OF EXEMPLARY EMBODIMENTS

Figure 1:
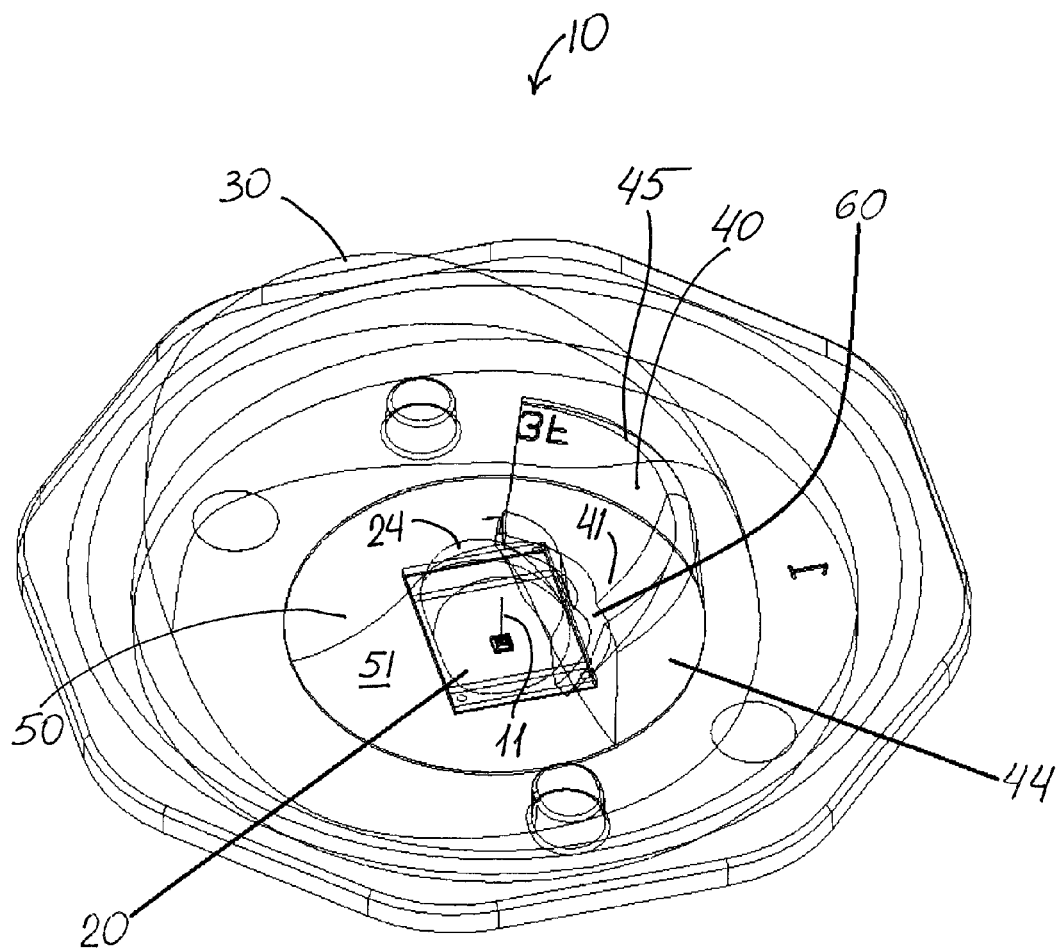
FIG. 1 is a front perspective view of one embodiment of the lens of the present invention showing the lens over a light emitter.

FIGS. 1-6, 8-12, 16, 18, 20, 22 and 24-26 show aspects of an exemplary embodiment of a lens 10 in accordance with this invention. Lens 10 is configured for distribution of light from a light emitter 20 having an emitter axis 11. The LED emitter may include a single LED (or a closely-spaced group of LEDs) mounted either directly on a circuit board or in the form of an LED package with the LED(s) on a submount on the board. A primary lens may be disposed directly over the LED(s). The primary lens over the LED(s) may be a lens according to the present invention. However, in illustrated embodiments, lens 10 is a secondary lens placed over the primary lens as seen in FIGS. 1 and 10.

Lens 10 has an outer surface 30 and a total internal reflection (TIR) surface 40 positioned outwardly of and around emitter 20 such that light received by TIR surface 40 is totally internally reflected toward outer surface 30. TIR surface 40 includes at least one recessed region 41 extending away from light emitter 20.

Figure 8:
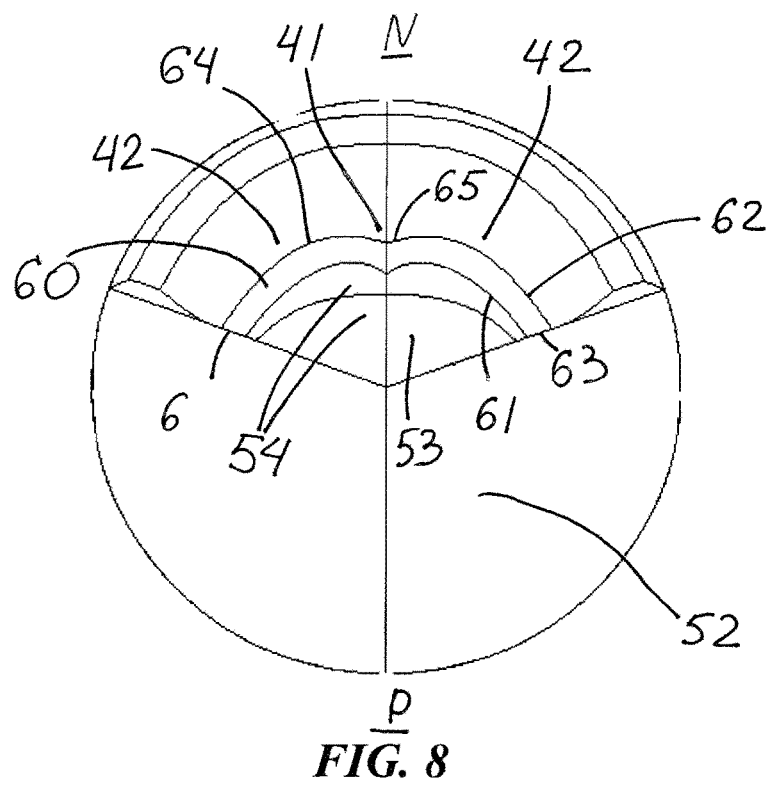
FIG. 8 is an inside-surface transparent plan view of the lens of FIG. 1, showing the geometric configuration of light-modifying surfaces surrounding the emitter.
Figure 9:
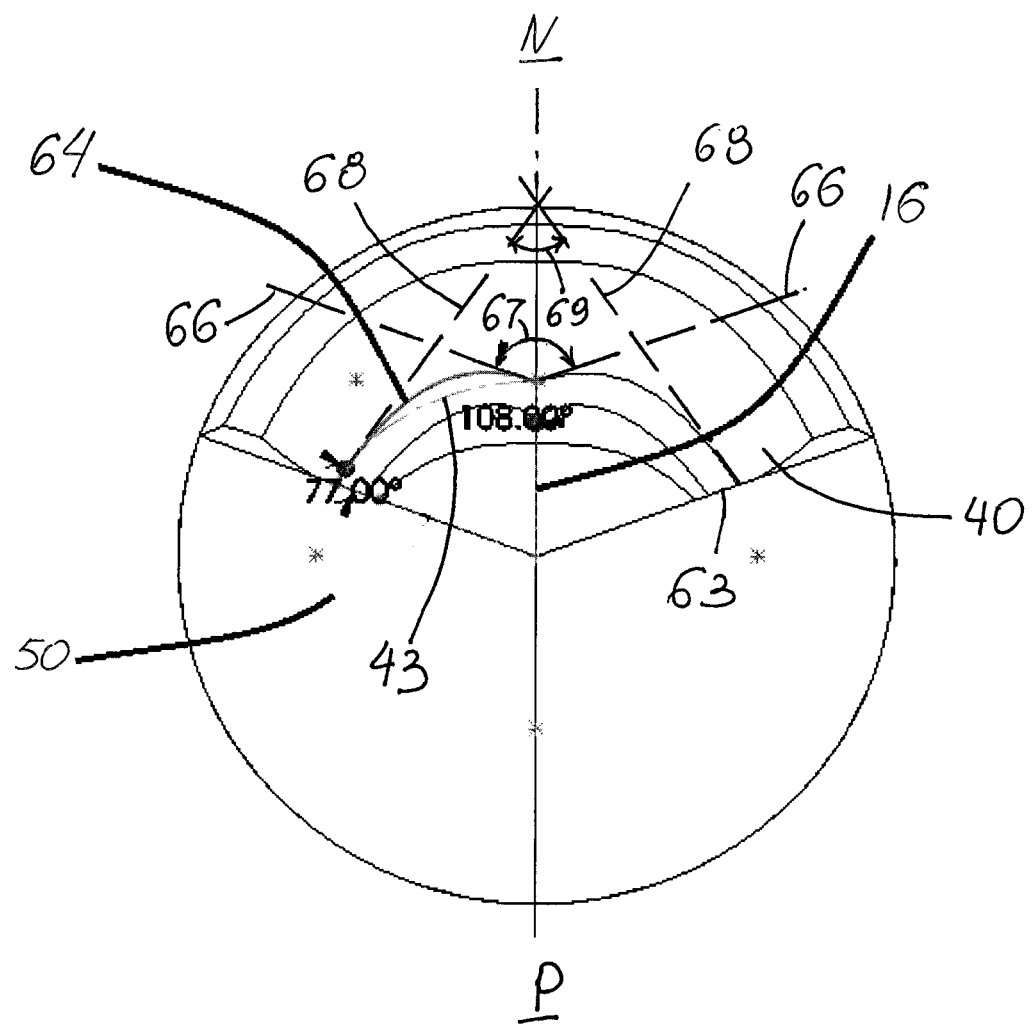
FIG. 9 is an inside-surface transparent plan view of the lens as in FIG. 8, but shown with markings of the geometric shapes of the intermediate surface of the lens.
Figure 10:
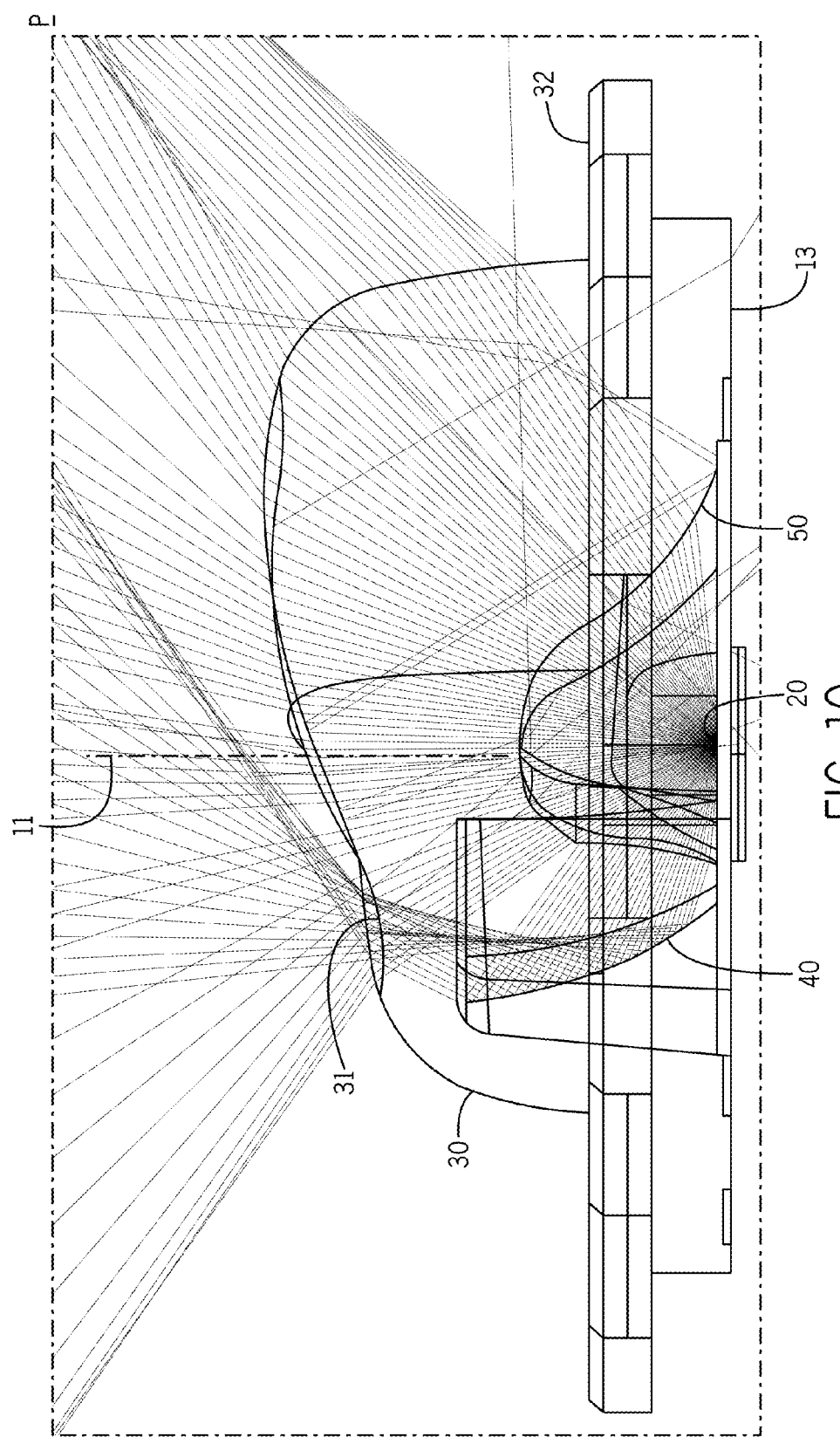
FIG. 10 is a side elevation of the lens of FIG. 1 with rays representing direction of light by the lens surfaces in plane 10-10 as indicated in FIG. 2.

FIGS. 8 and 9 show that TIR surface 40 is substantially cross-sectionally convex. FIGS. 4, 5, 8, 9 and 12 also show TIR surface 40 having two cross-sectionally convex surface portions 42 with recessed region 41 therebetween. FIG. 8 best shows recessed region 41 substantially cross-sectionally smoothly concave and smoothly adjoining adjacent convex portions 42 of TIR surface 40.

FIGS. 12, 13 and 16-23 illustrate that recessed region 41 of TIR surface 40 also facilitates lateral diffusion of highest-intensity light in the middle of the light distribution. FIG. 9 illustrates that the presence of recessed region 41 decreases radii of curvature of convex portions 42 which increases the curvature at each particular point as compared to curvature 43 of entire TIR surface 40. Due to such increased curvature, TIR surface 40 reflects light at angles which are greater than angles of an alternative lens 10C with a smooth TIR surface 40C seen in FIG. 13.

Figure 16:
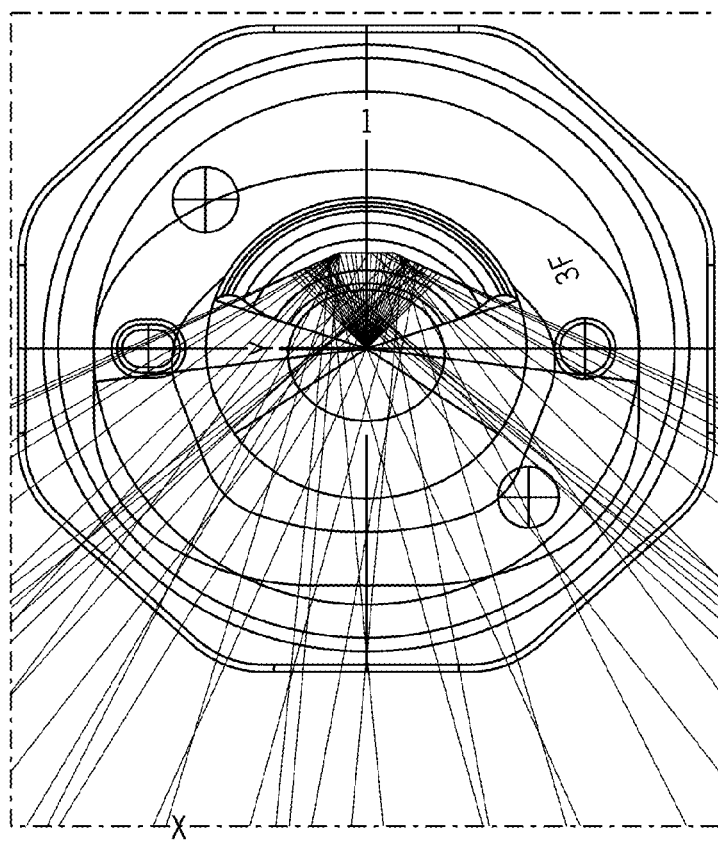
FIG. 16 is a plan view of a lens according to the present invention seen from the light output side and schematically illustrating the light distribution by the lens.
Figure 17:
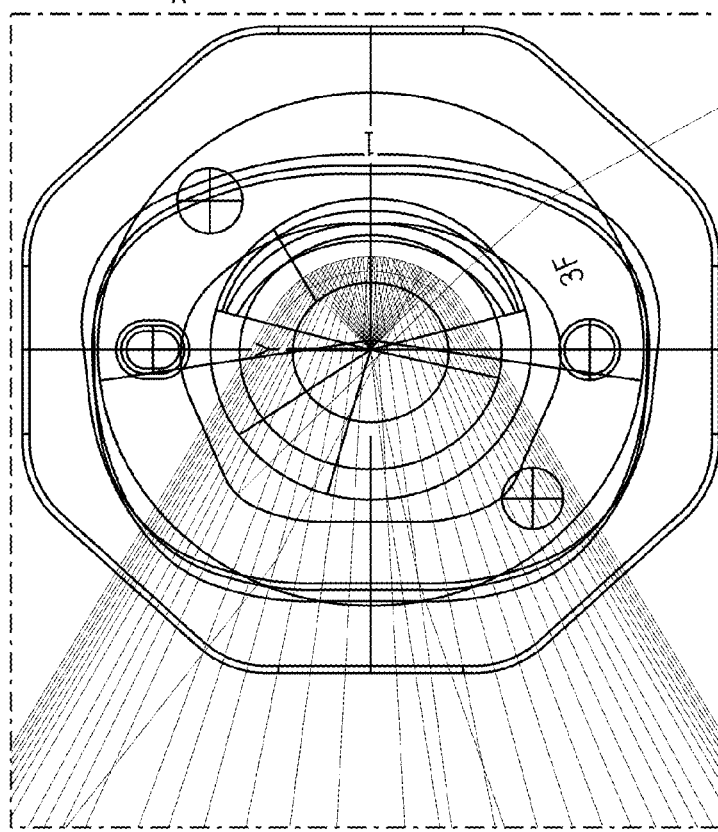
FIG. 17 is a plan view similar to FIG. 16, but of a prior lens, schematically illustrating the light distribution by such prior lens.
Figure 18:
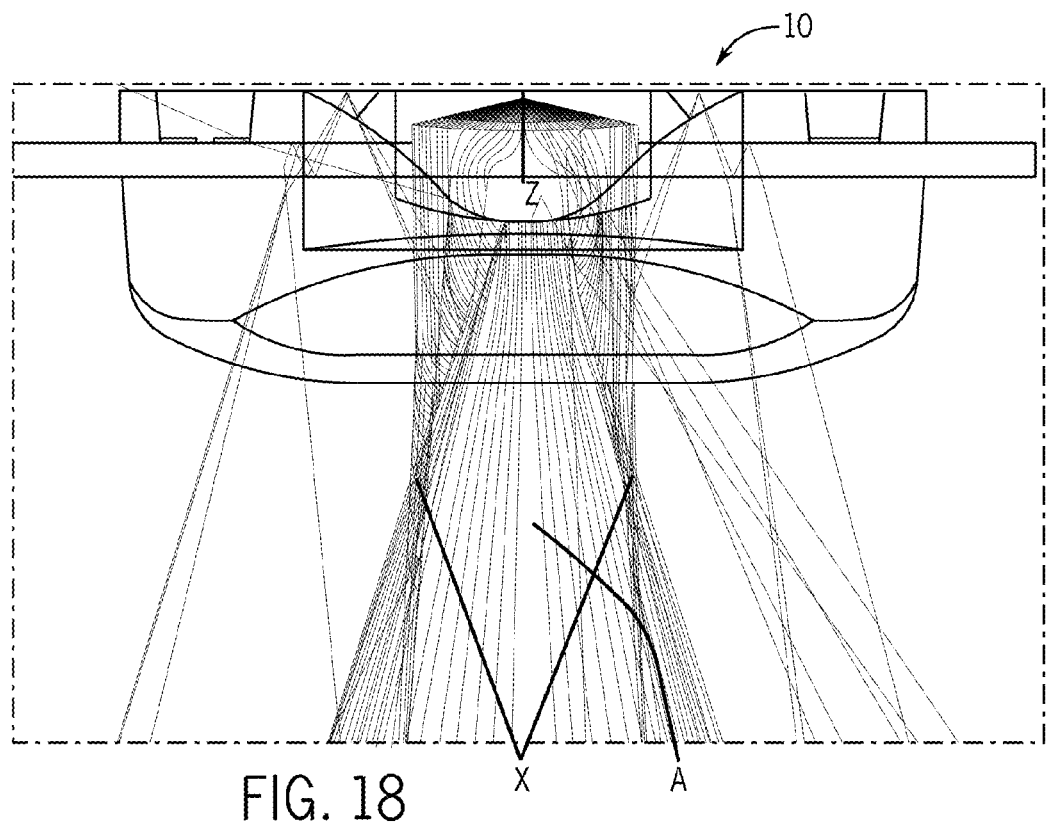
FIG. 18 is a front elevation the lens of FIG. 16 schematically illustrating light distribution by the lens.
Figure 19:
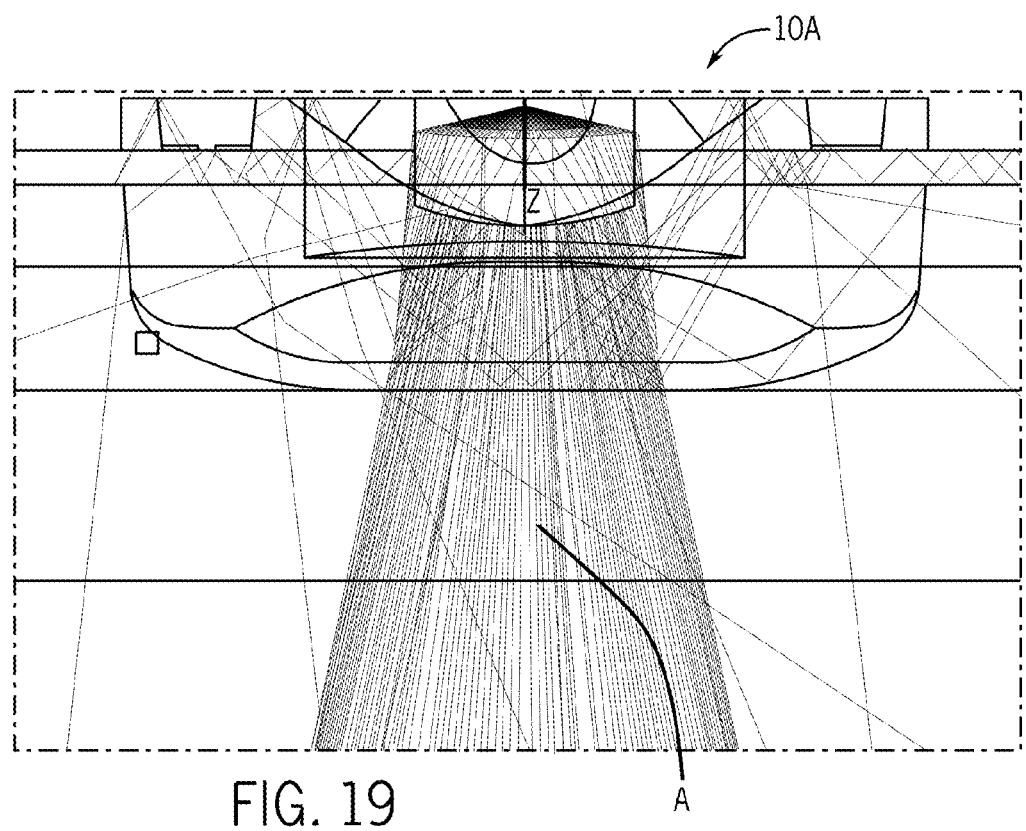
FIG. 19 is a front elevation of the prior lens of FIG. 17 schematically illustrating light distribution by such prior lens.
Figure 20:
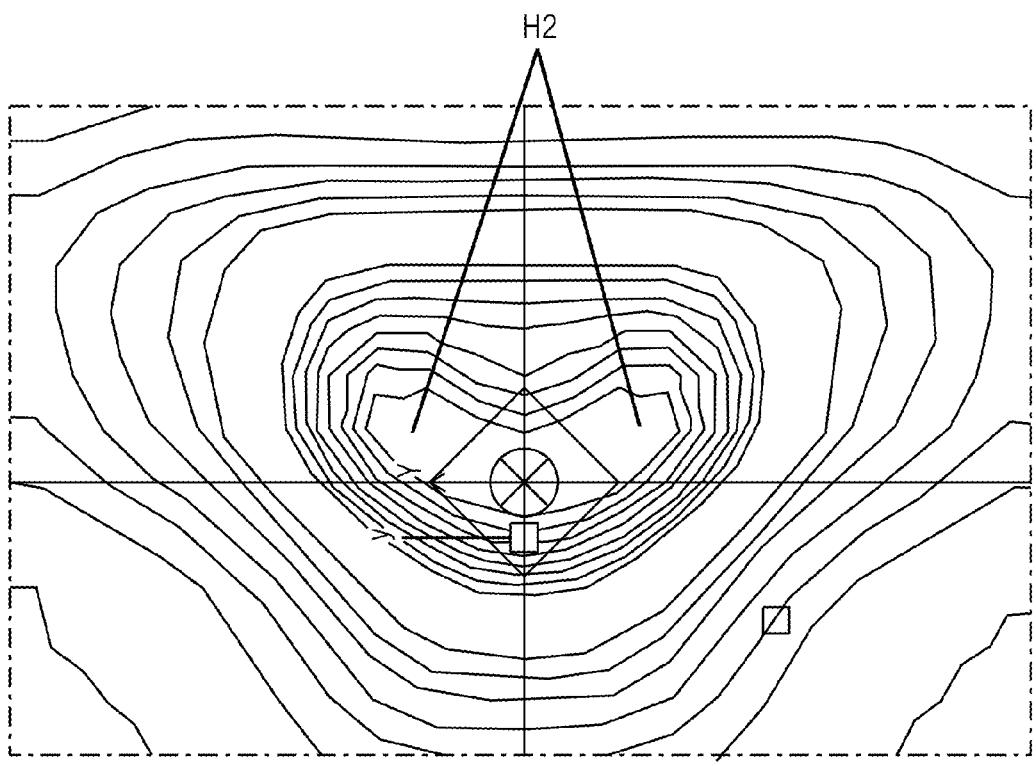
FIG. 20 is a schematic two-dimensional ISO plot of luminance intensity by the lens FIGS. 16 and 18 on an illuminated surface substantially normal to the emitter axis.
Figure 21:
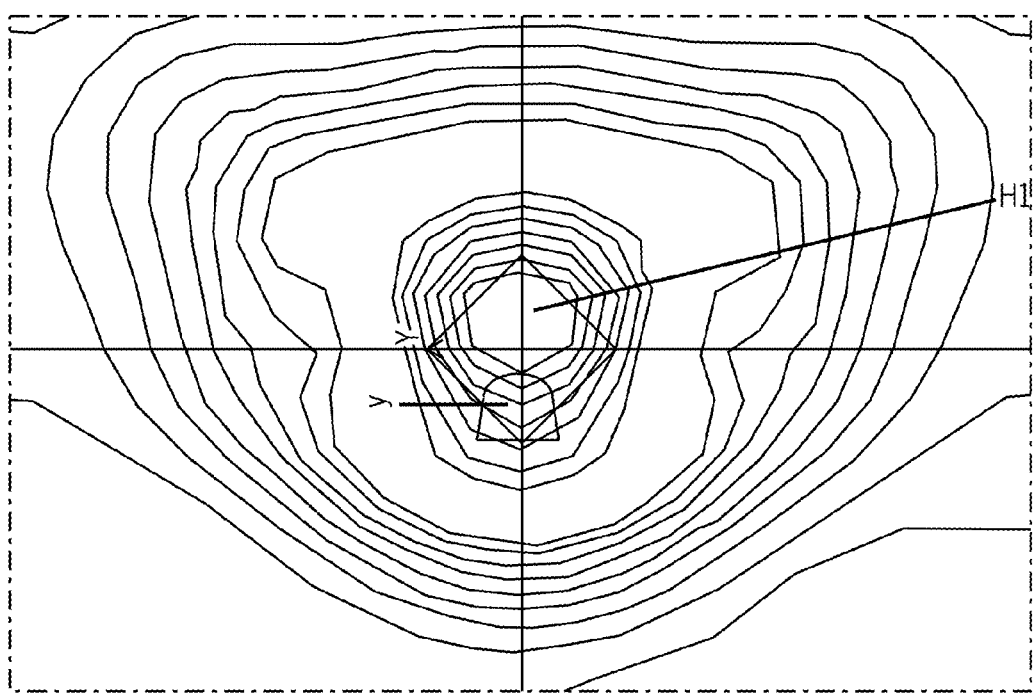
FIG. 21 is a two-dimensional ISO plot of luminance intensity by the prior lens of FIGS. 17 and 19 on an illuminated surface substantially normal to the emitter axis.
Figure 22:
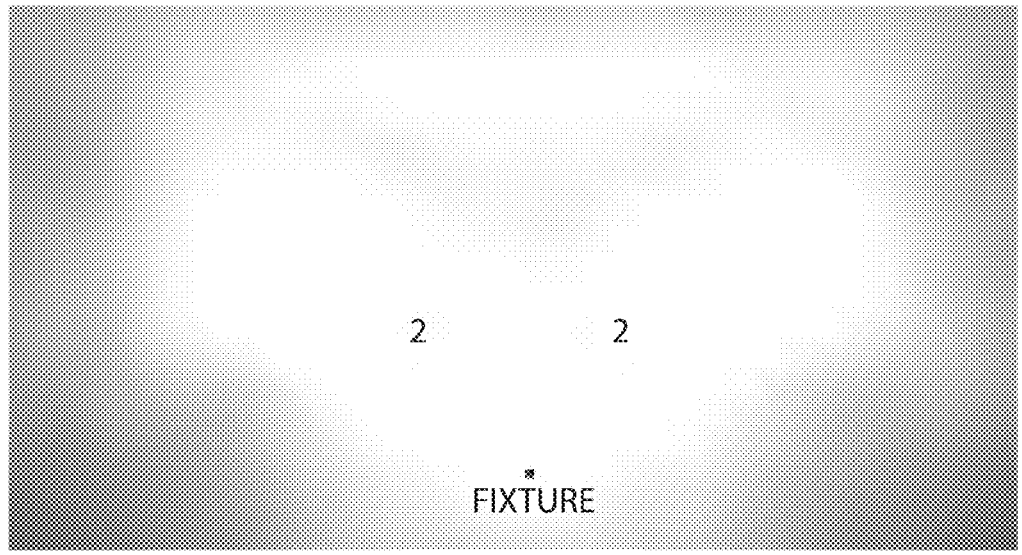
FIG. 22 is a luminance rendering of light distribution by the lens of FIGS. 16 and 18 on an illuminated surface substantially normal to the emitter axis.
Figure 23:
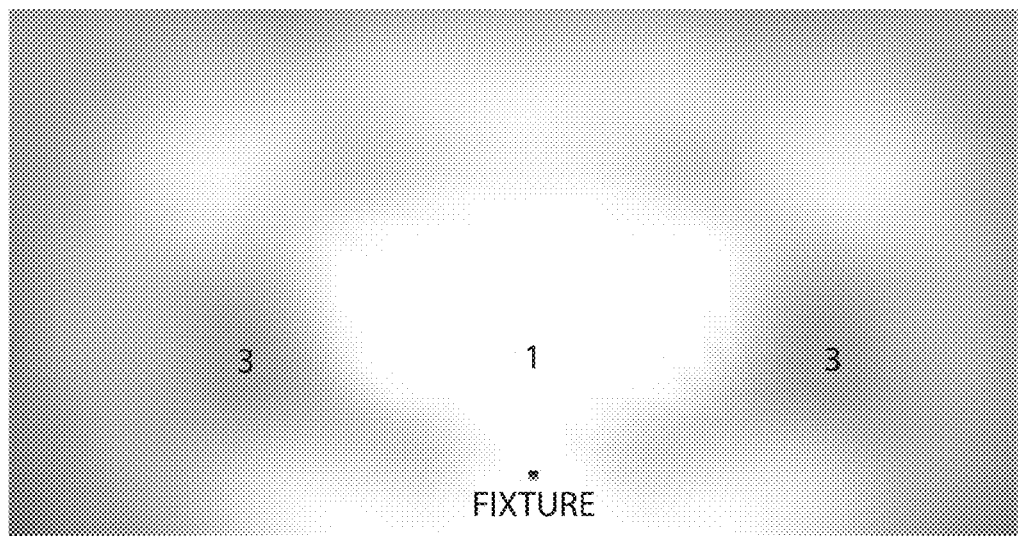
FIG. 23 is a luminance rendering of light distribution by the prior lens of FIGS. 17 and 19 on an illuminated surface substantially normal to the emitter axis.

FIGS. 16-23 show comparisons of performance of lens 10 of the present invention with a prior lens 10A. In particular, FIG. 16 shows that greater TIR angles of lens 10 of the present invention provide a wider forward light distribution than prior lens 10A, as seen in FIG. 17. FIG. 18 illustrates a light output with a the cris-cross effect X caused by recessed region 41 of TIR surface 40 as compared to light output by prior lens 10A, as illustrated in FIG. 19. FIGS. 20 and 22 illustrate that such cris-cross effect provides a desirable diffusion of light A in the center of the distribution where the highest intensity of light naturally occurs. The result is less density of axial light A when compared to distribution by prior lens 10A, as illustrated in FIGS. 21 and 23. FIGS. 20 and 21 schematically illustrate Type III distribution at 4800 lumens (lm). As seen in FIG. 21, light distribution by prior lens 10A with a smooth TIR surface 40A includes a so-called "hot spot" H of 1.37 foot candles (fc). It is seen in FIG. 20, lens 10 with TIR surface 40 of the present invention diffuses hot spot H1 to a wider pattern H2 which is only 0.83 fc. This facilitates uniformity of the resulting light pattern with a smoother distribution (seen in FIG. 22) that is more pleasing to the eye than prior distribution with greater contrasts between the areas of light distribution, as seen in FIG. 23.

Figure 14:
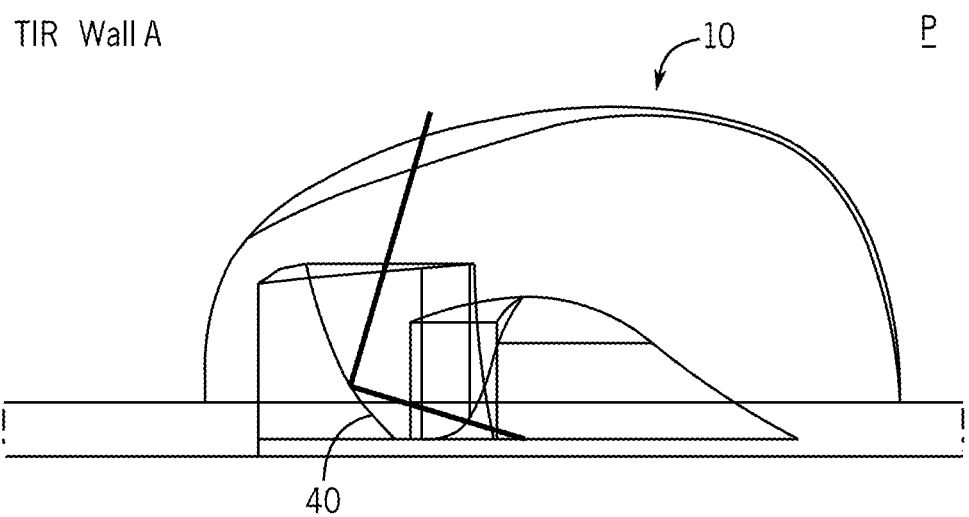
FIG. 14 is a shaded side elevation of the lens of FIG. 12 schematically illustrating an example of light reflected from the TIR surface according to the present invention.
Figure 15:
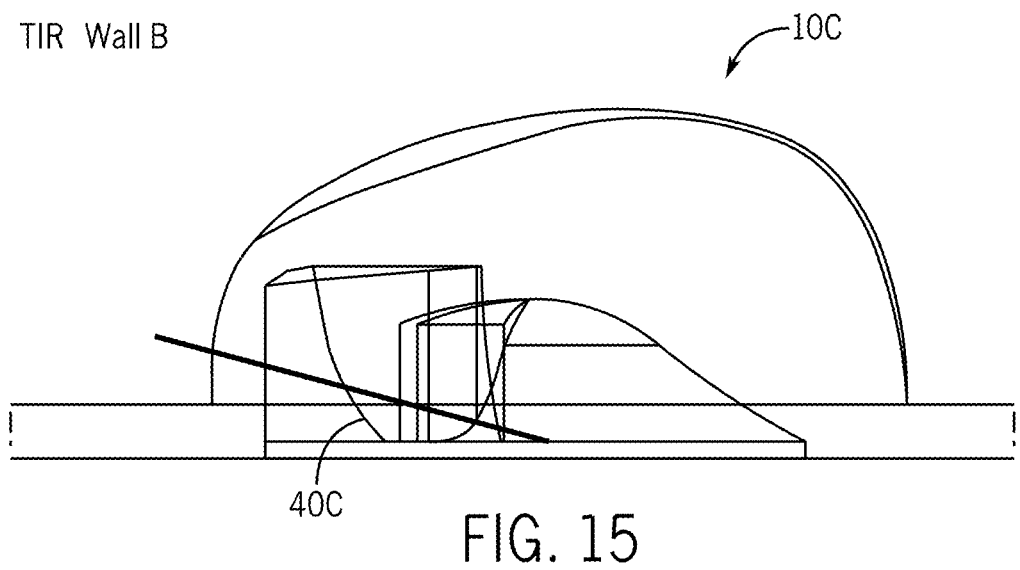
FIG. 15 is a shaded side view of the lens of FIG. 13 schematically illustrating an example of light passing through the smooth TIR surface.

As illustrated in FIGS. 14 and 15, recessed region 41 of TIR surface 40 facilitates increase in the amount of totally internally reflected light at desirable angles. In particular, FIG. 15 shows alternative lens 10C with a smooth TIR surface 40C. When emitter light reaches such smooth TIR surface, it is typically reflected at substantially high angles which direct such light substantially along the emitter axis toward the "hot spot" area. As mentioned above, it is desirable to diffuse light away from the center of a particular light distribution. FIG. 15 illustrates that one way to attempt diffusing light that arrives at the middle region of the TIR surface is to decrease the angle of TIR surface 40C such to direct such light forward away from the "hot spot" area. However, FIG. 15 shows that, if the angle of the TIR surface is decreased too much, light reaches TIR surface 40C at angles below the critical angle for total internal reflection and just passes through TIR surface 40C. As a result, such light is lost for useful illumination. As seen in FIG. 14, because of recessed region 41 of TIR surface 40, the critical TIR angle is smaller, thereby broadening the range of angles for reflection of light that reaches TIR surface 40 instead of such light passing through, thereby facilitating efficiency of the lens.

In the illustrated embodiments, lens 10 is configured for distributing light from light emitter 20 predominantly toward a preferential side P. As seen in FIGS. 8 and 9, TIR surface 40 is centered substantially on a non-preferential side N, which is opposite preferential side P, to redirect light toward preferential side P. The TIR surface may span an angle in the range 90-180° around emitter axis 11. TIR surface 40 is shown spanning about 140° around emitter axis 11.

Figure 2:
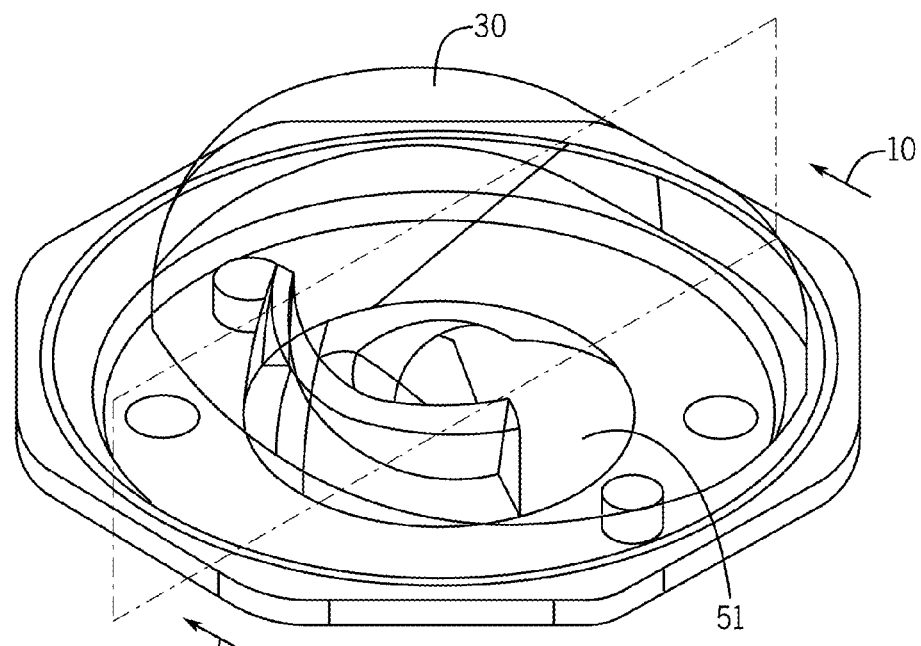
FIGS. 2 and 3 are rear perspective views showing the lens of FIG. 1 with surface shading.
Figure 3:
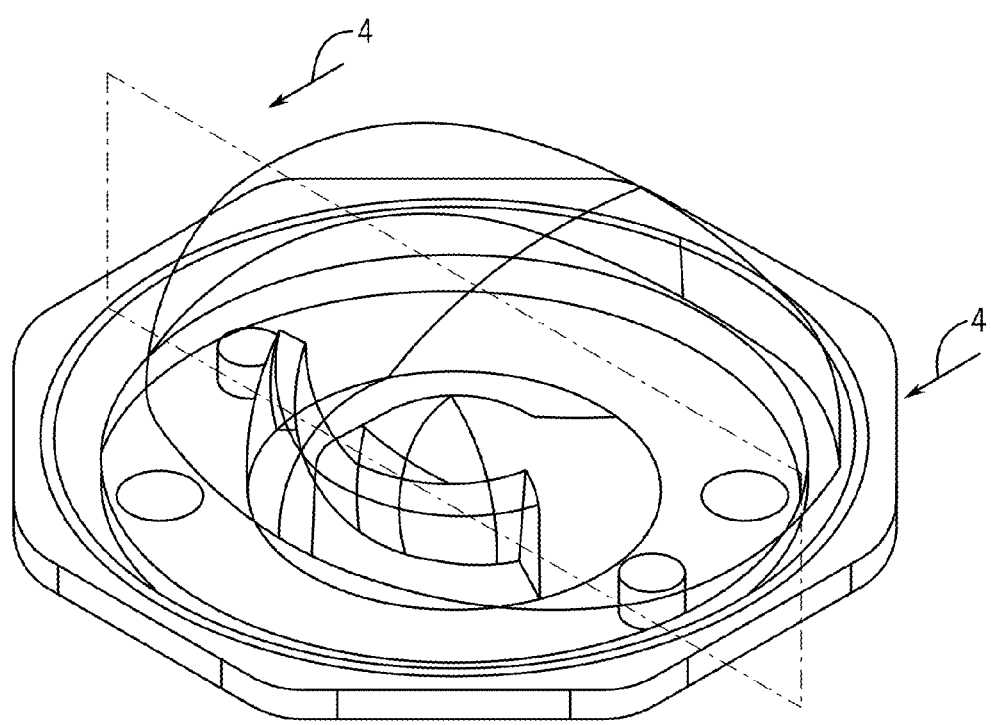
Figure 11:
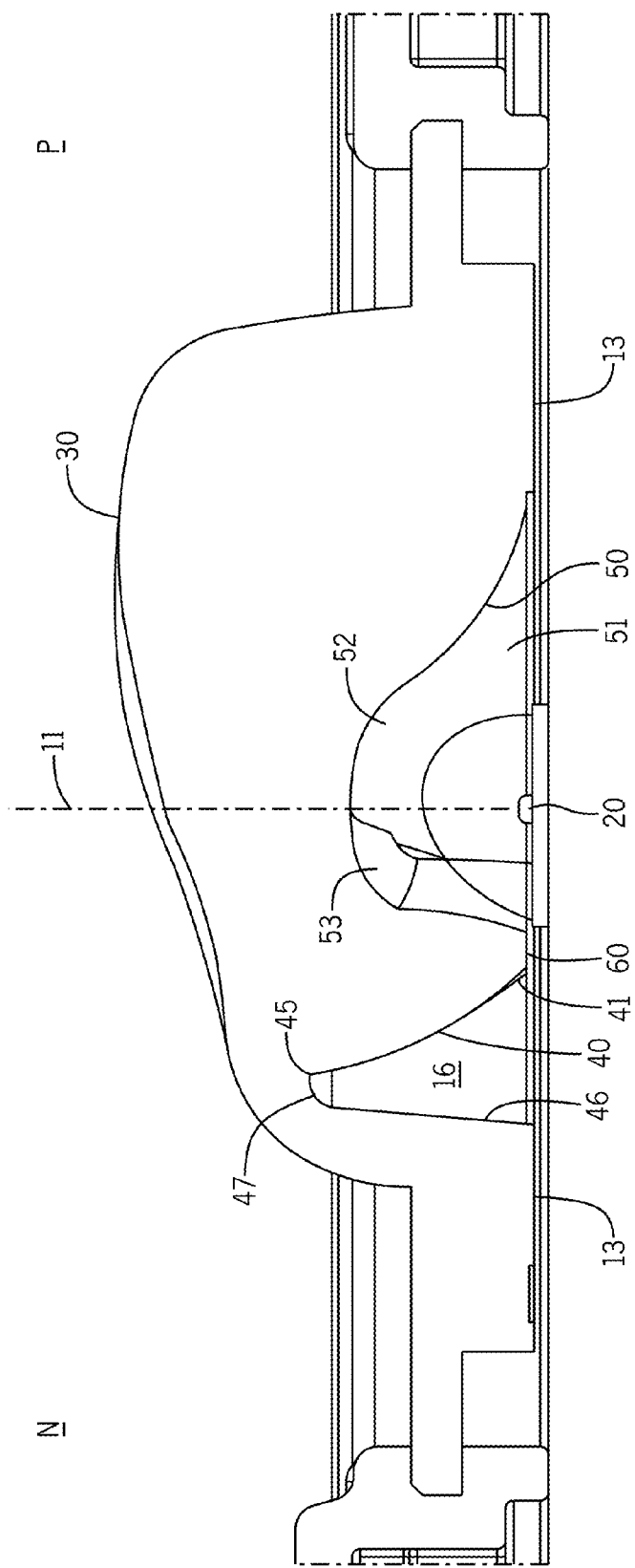
FIG. 11 is an opaque cross-sectional view of the lens of FIG. 1 taken along plane 10-10 as indicated in FIG. 2.

FIG. 10 best shows that lens 10 includes a refracting inner surface 50 configured for refracting light from light emitter 20 predominantly toward preferential side P. As best seen in FIGS. 1-3, inner surface 50 defines an inner cavity 51 about emitter axis 11. It is best seen in FIGS. 8 and 11 that refracting inner surface 50 has a front sector 52 and a back sector 53. Front sector 52 is centered on preferential side P and refracts emitter light predominantly toward outer surface 30. As best seen in FIGS. 8-10, back sector 53 is centered on non-preferential N side radially opposite preferential side P and has a back-sector surface configuration 54 which differs from the surface configuration of front sector 52.

Figure 6:
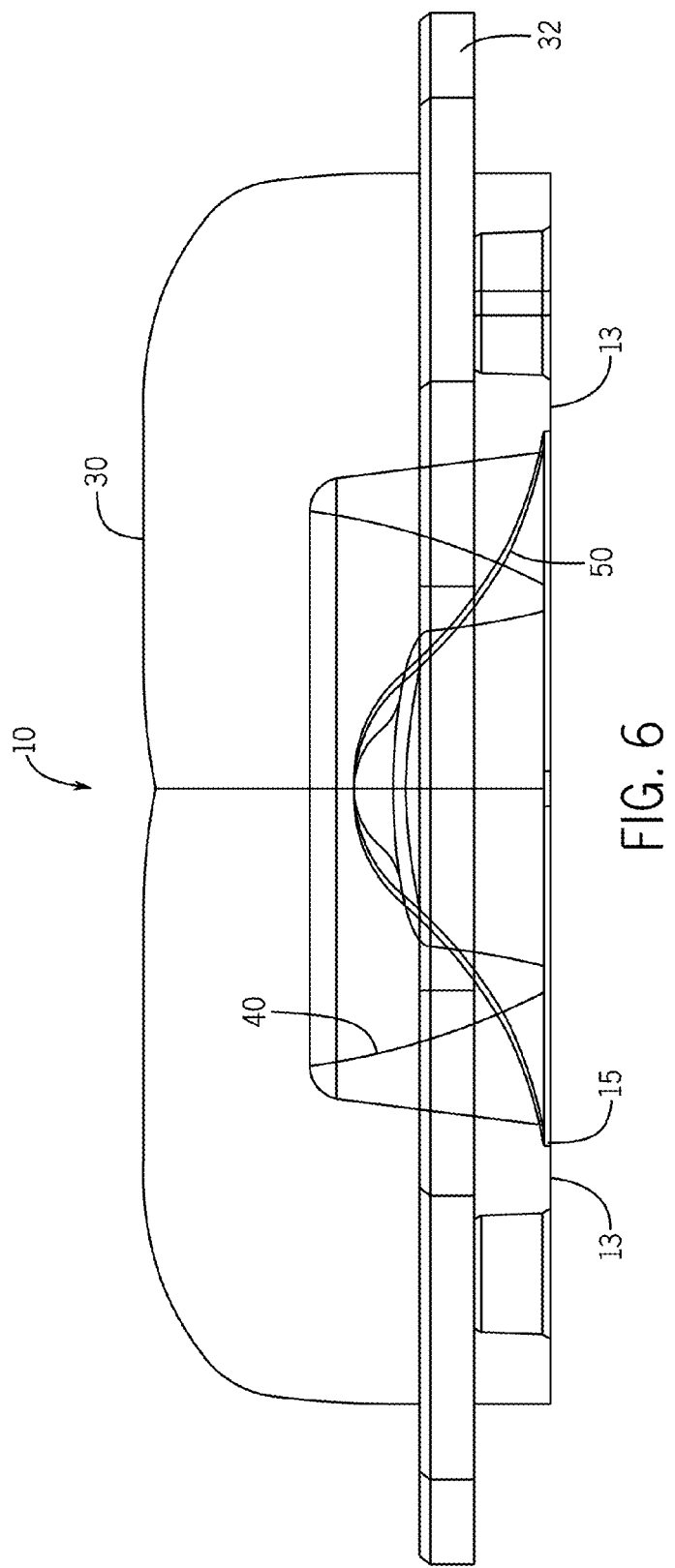
FIG. 6 is a front elevation of the lens of FIGS. 1-5.
Figure 7:
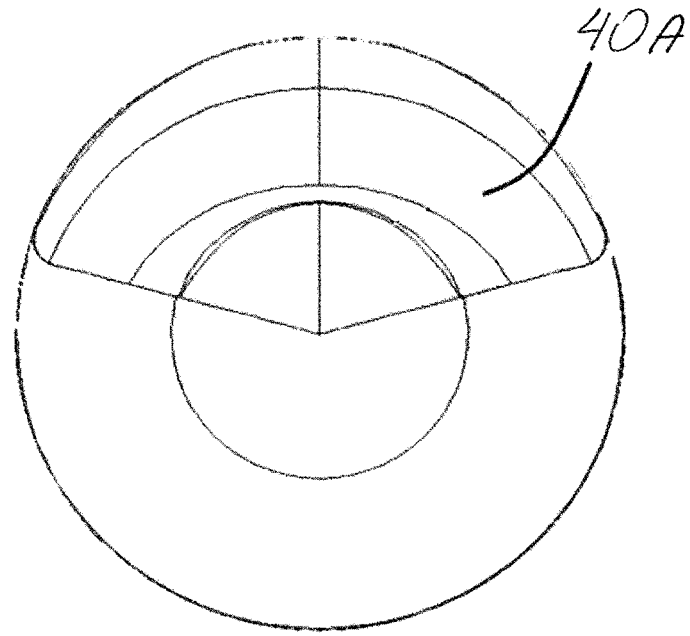
FIG. 7 is an inside-surface transparent plan view of an example of a prior lens.

FIGS. 6 and 11 show that lens 10 has a base surface 13 adjacent an emitter plane 14 defined by a surface supporting emitter 20. Base surface 13 forms an opening 15 about emitter 20. FIGS. 6 and 11 show inner surface 50 extending from opening 15.

FIGS. 10 and 11 show TIR surface 40 partially bounding a secondary cavity 16 which is offset from inner cavity 51. FIGS. 1-5 and 11 show TIR surface 40 terminating remotely from base surface 13 at a distal edge 45. FIGS. 1-5 show distal edge 45 having substantially continuous convex configuration. Secondary cavity 40 is also partially bounded by an axially-remote surface 46 extending from base surface 13 toward TIR surface 40 and offset therefrom by an end surface 47 which extends from distal edge 45 of TIR surface 40 to axially-remote surface 46.

As best seen in FIGS. 8-11, secondary cavity 44 is offset from inner cavity 51 with an intermediate surface 60 therebetween. Intermediate surface 60 is shown to be substantially orthogonal to emitter axis 11.

Figure 4:
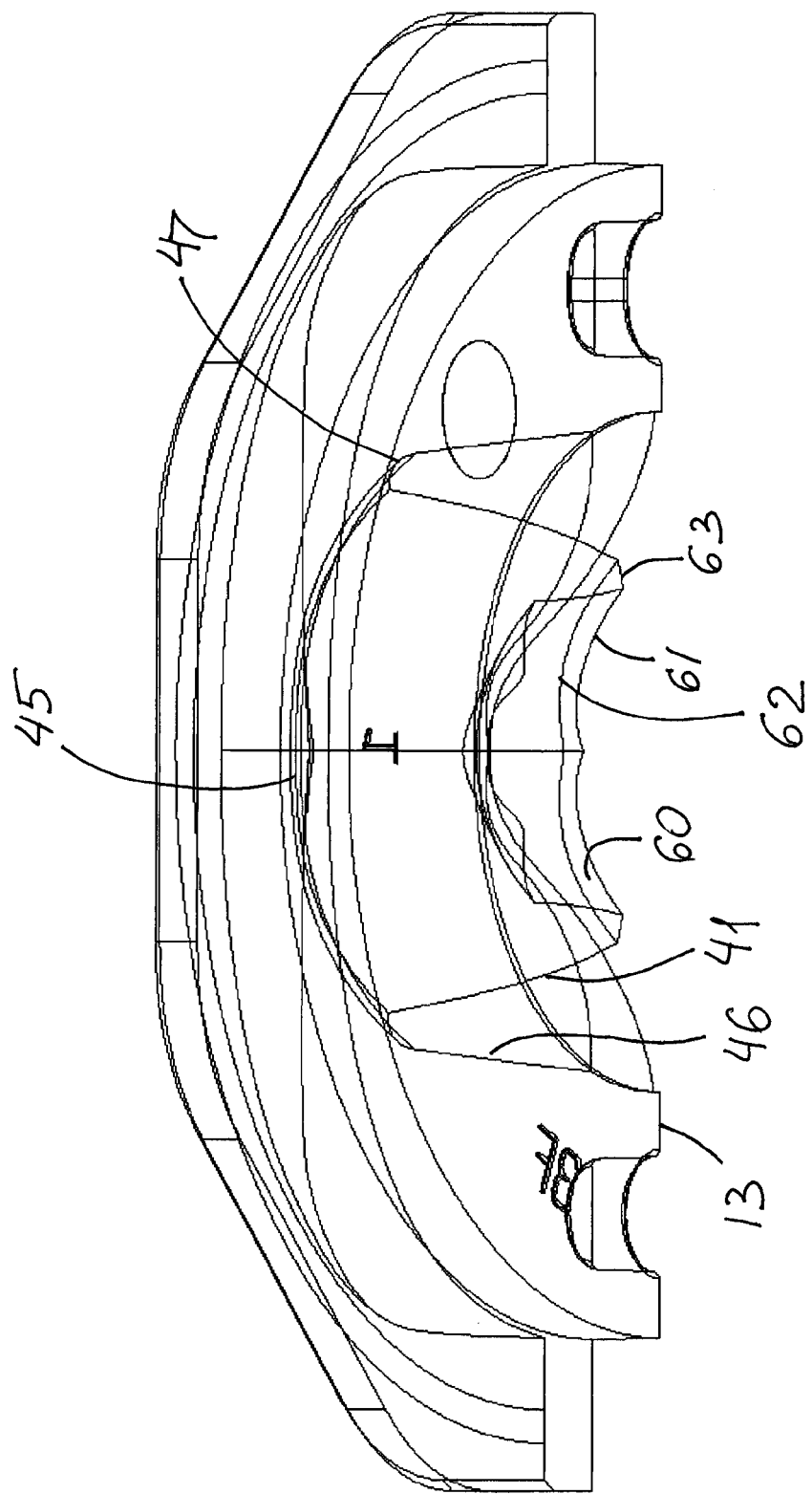
FIG. 4 is a cross-sectional perspective view of the lens of FIG. 3 taken along section 4-4 as shown in FIG. 3.

As best shown in FIGS. 4, 8 and 9, intermediate surface 60 includes a front edge 61 and a rear edge 62 with a pair of side edges 63 therebetween. As seen in FIG. 11, TIR surface 40 extends from rear edge 62 of intermediate surface 60. It is best illustrated in FIGS. 8 and 9 that rear edge 62 of intermediate surface 60 is shaped by two convex edge portions 64 each extending from the respective side edge 63 toward a front-to-rear centerline 16 and inwardly toward emitter axis 11, thereby forming a recessed edge portion 65 on centerline 16. Recessed edge portion 65 is shown substantially smoothly concave and smoothly adjoining adjacent convex edge portions 64.

As illustrated in FIG. 9, convex edge portions 64 define two central tangent lines 66 transverse to centerline 16. The angle 67 between central tangent lines 66 is less than 180°. Convex edge portions 64 are shown to define two side tangent lines 68 transverse to centerline. FIG. 9 shows that the angle 69 between side tangent lines 68 is less than angle 67 between central tangent lines 66.

It should be understood that, in some embodiments of the lens according to the present invention, the intermediate surface may be configured such that the side tangent lines are substantially parallel to the centerline. Alternatively, the intermediate surface may be configured such that the side tangent lines define such angle therebetween which is greater than the angle between the central tangent lines.

Figure 5:
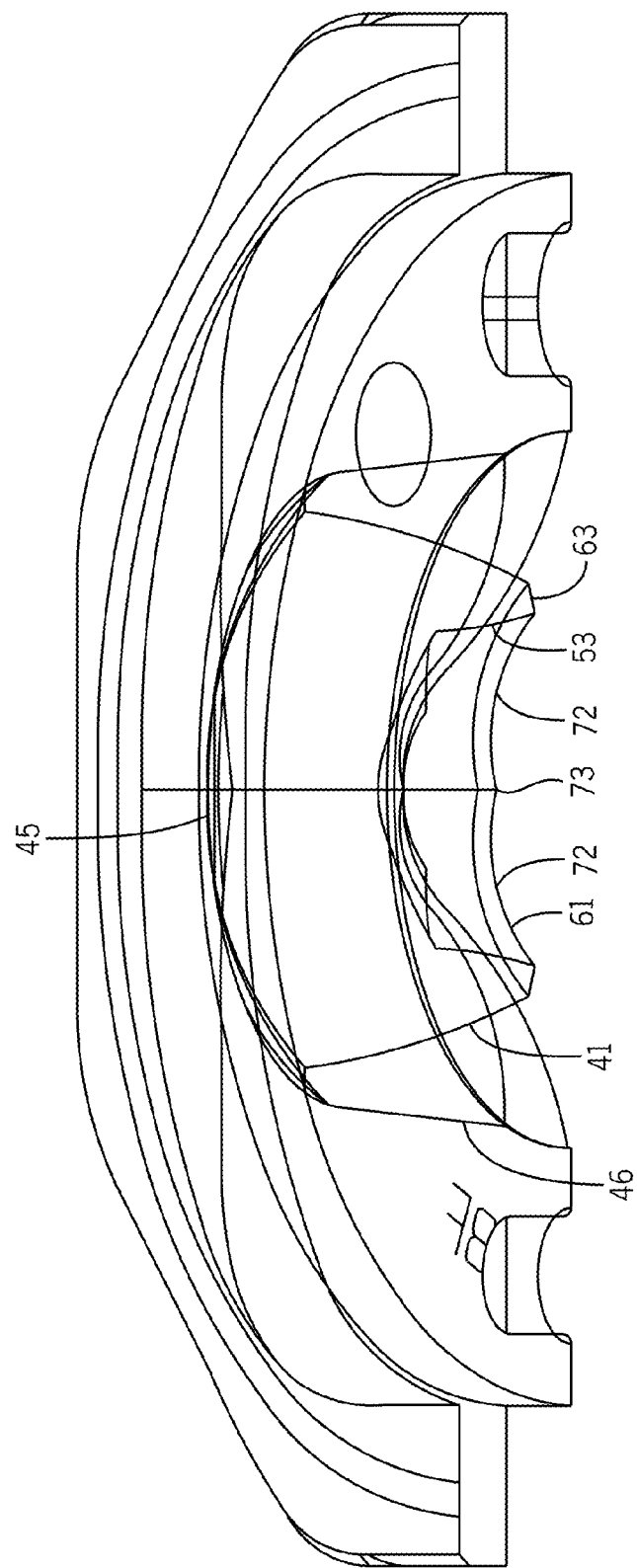
FIG. 5 is the cross-sectional view as in FIG. 4, but shown with surface shading.
Figure 12:
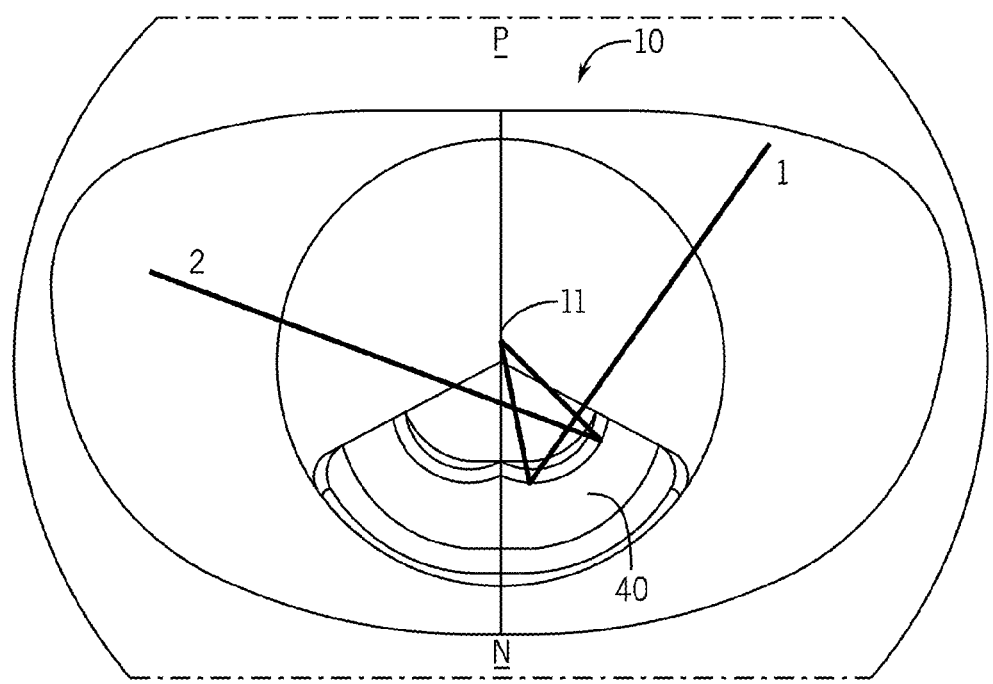
FIG. 12 is a shaded plan view of a lens according to the present invention seen from the light-output side and schematically illustrating examples of directions of light reflected from the TIR surface according to the present invention.
Figure 13:
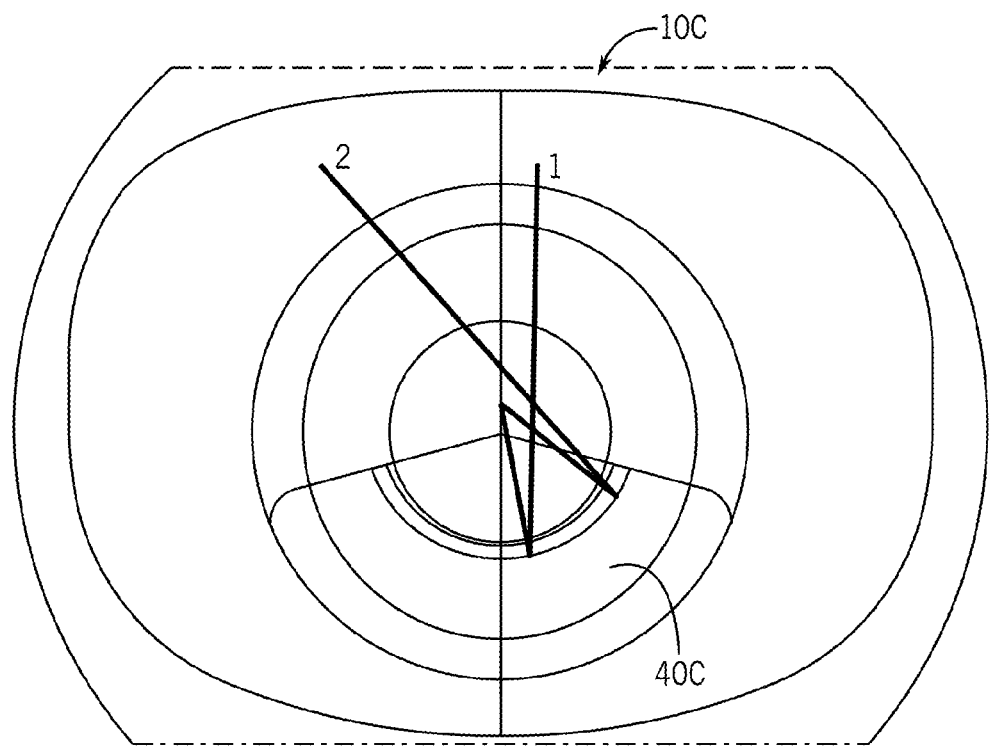
FIG. 13 is a shaded plan view similar to FIG. 12, but of an alternative lens with a smooth TIR surface, schematically illustrating examples of directions of light reflected from a smooth TIR surface.

FIGS. 4, 5 and 11 best show back sector 53 of inner surface 50 extending from front edge 61 of intermediate surface 60. It is best seen in FIGS. 5 and 8 that front edge 61 of intermediate surface 60 is shaped by two convex front-edge portions 72 each extending from respective side edge 63 toward front-to-rear centerline 16 and inwardly toward emitter axis 11, thereby forming a recessed front-edge portion 73 on centerline 16. It is best seen in FIG. 12 that emitter axis is offset from front-edge portion 73 toward preferential side P. FIG. 8 shows that front edge 61 of intermediate surface 60 is substantially equidistant from rear edge 62 at positions along radii from emitter axis 11.

Figure 24:
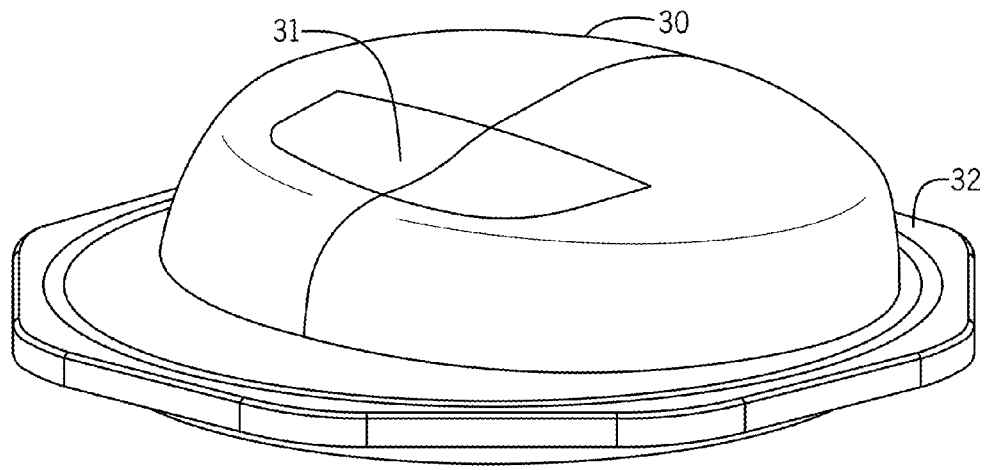
FIGS. 24 and 26 are opaque rear perspective views of the lens of FIG. 1, showing a non-convex region of the outer surface of the lens.
Figure 25:
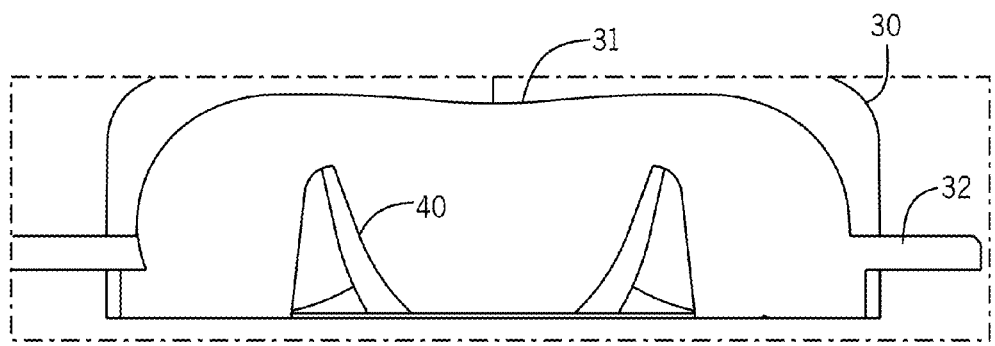
FIG. 25 is an opaque cross-sectional view of the lens of FIG. 1 taken along plane 25-25 shown on FIG. 26.
Figure 26:
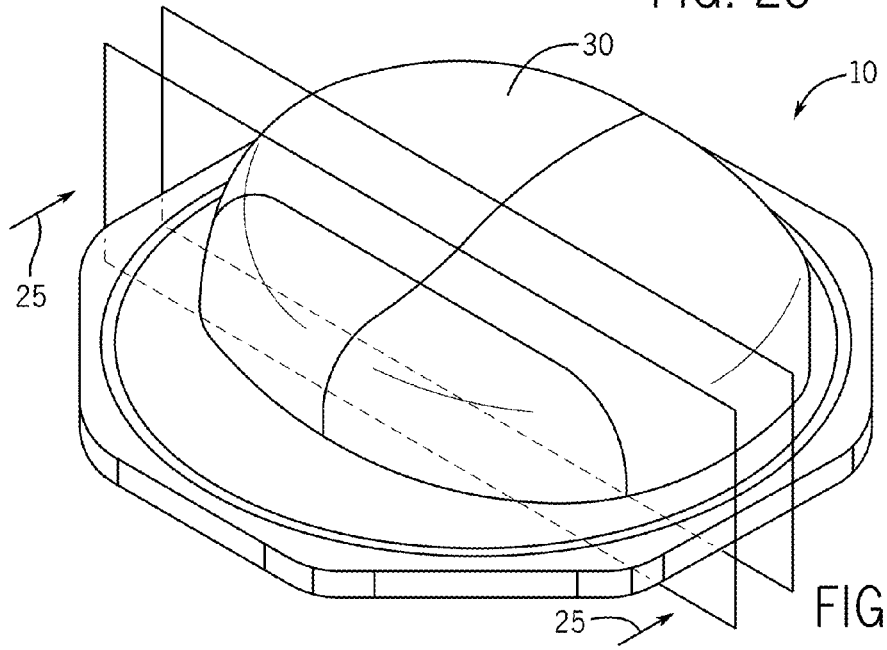

In FIG. 10, outer surface 30 is seen configured for refracting emitter light predominantly toward preferential side P. FIGS. 24-26 show outer surface 30 having a non-convex region 31 positioned substantially over TIR surface 40. Non-convex region 31 may be configured to have a minimal curvature or even be substantially flat such that light received from TIR surface 40 is further refracted by outer surface 30. It should be noted that the curvature of the non-convex outer surface region is configured to create high critical TIR angles of incidence for light reflected from the TIR surface in order to minimize total internal reflection of such light from the outer-surface region back into the lens.

Lens 10 is shown to have an outward flange 32 which extends from outer surface 30 away from emitter axis 11.

It should be noted that the configuration of inventive lens 10 as described above allows for molding of lens 10 in a single-piece mold. In other words, the lens configuration preferably permits easy removal of the lens from the mold without the need for separating the mold pieces as is the case with some lenses that require multiple-piece molds. The inventive lens can be simply pulled out of the mold.

Figure 33:
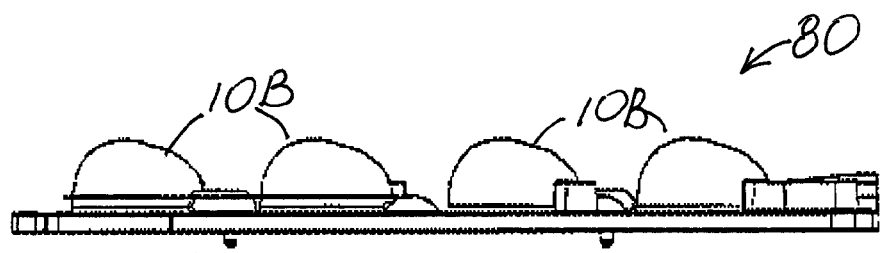
FIG. 33 is a side elevation of one embodiment of a lighting apparatus including a one-piece lensing member incorporating a plurality of the lenses each according to the present invention.
Figure 34:
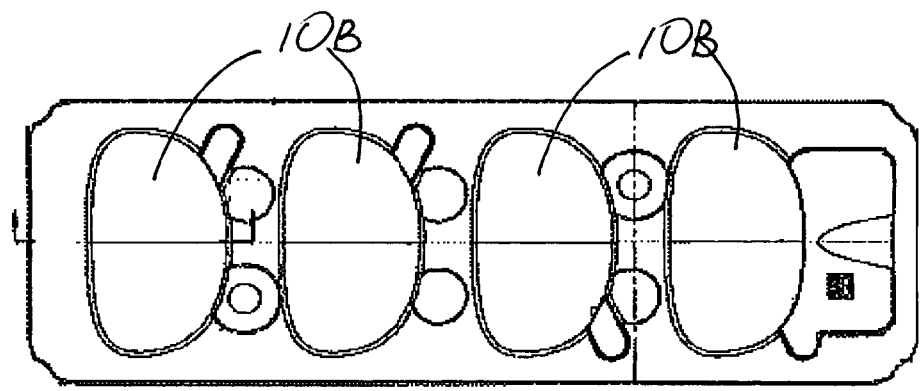
FIG. 34 is a plan view from the light-output side of the lighting apparatus of FIG. 33.
Figure 35:
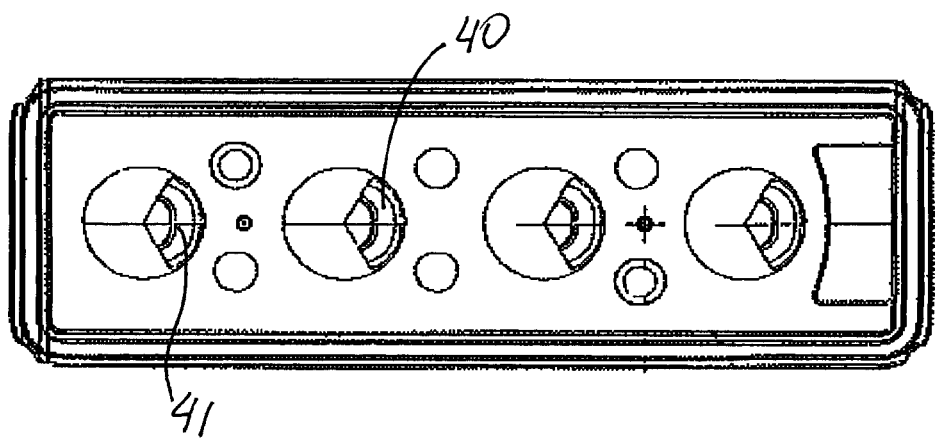
FIG. 35 is a plan view from the light-emitter side of the lighting apparatus of FIG. 33.
Figure 36:
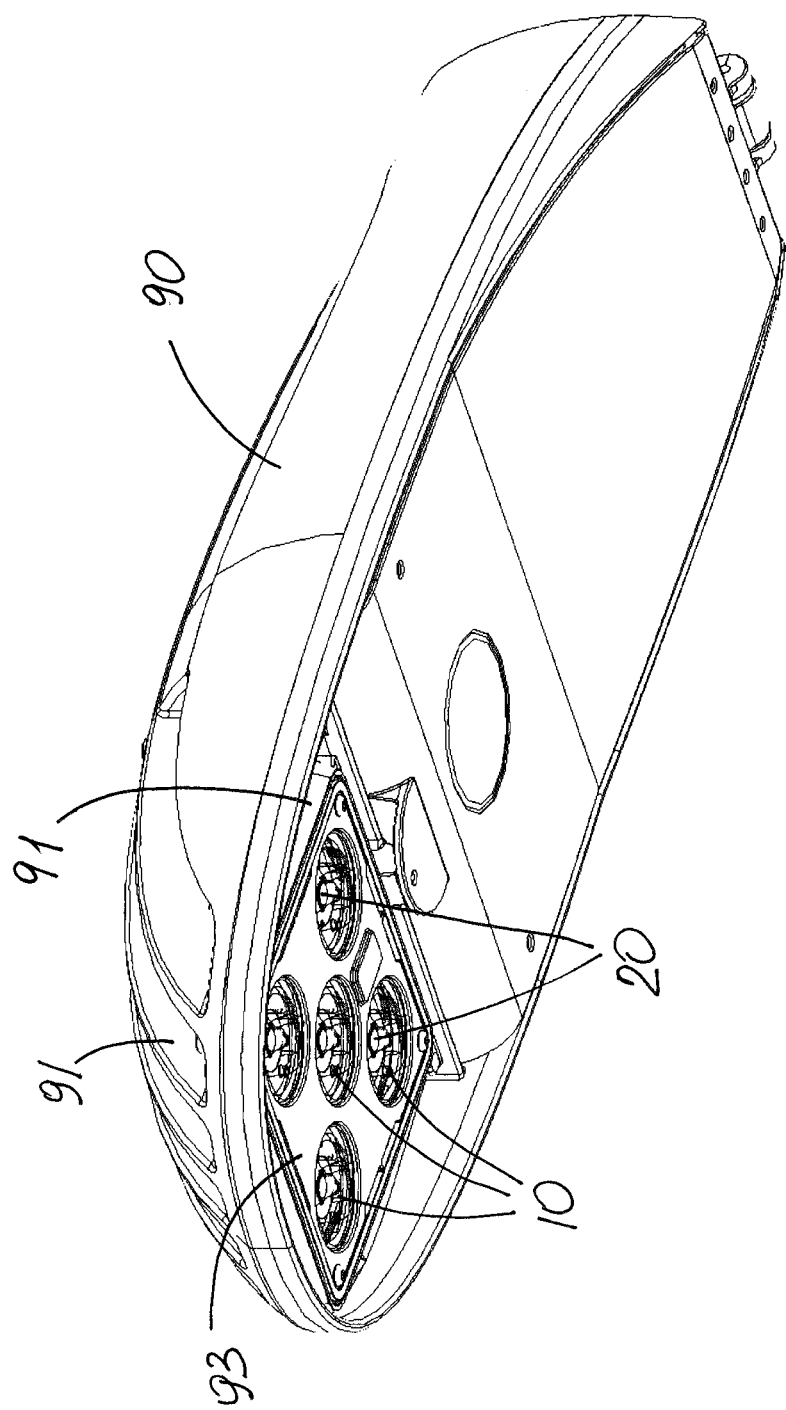
FIG. 36 is a perspective view of a light fixture incorporating an optical member with a plurality of lenses each according to the present invention.
Figure 37:
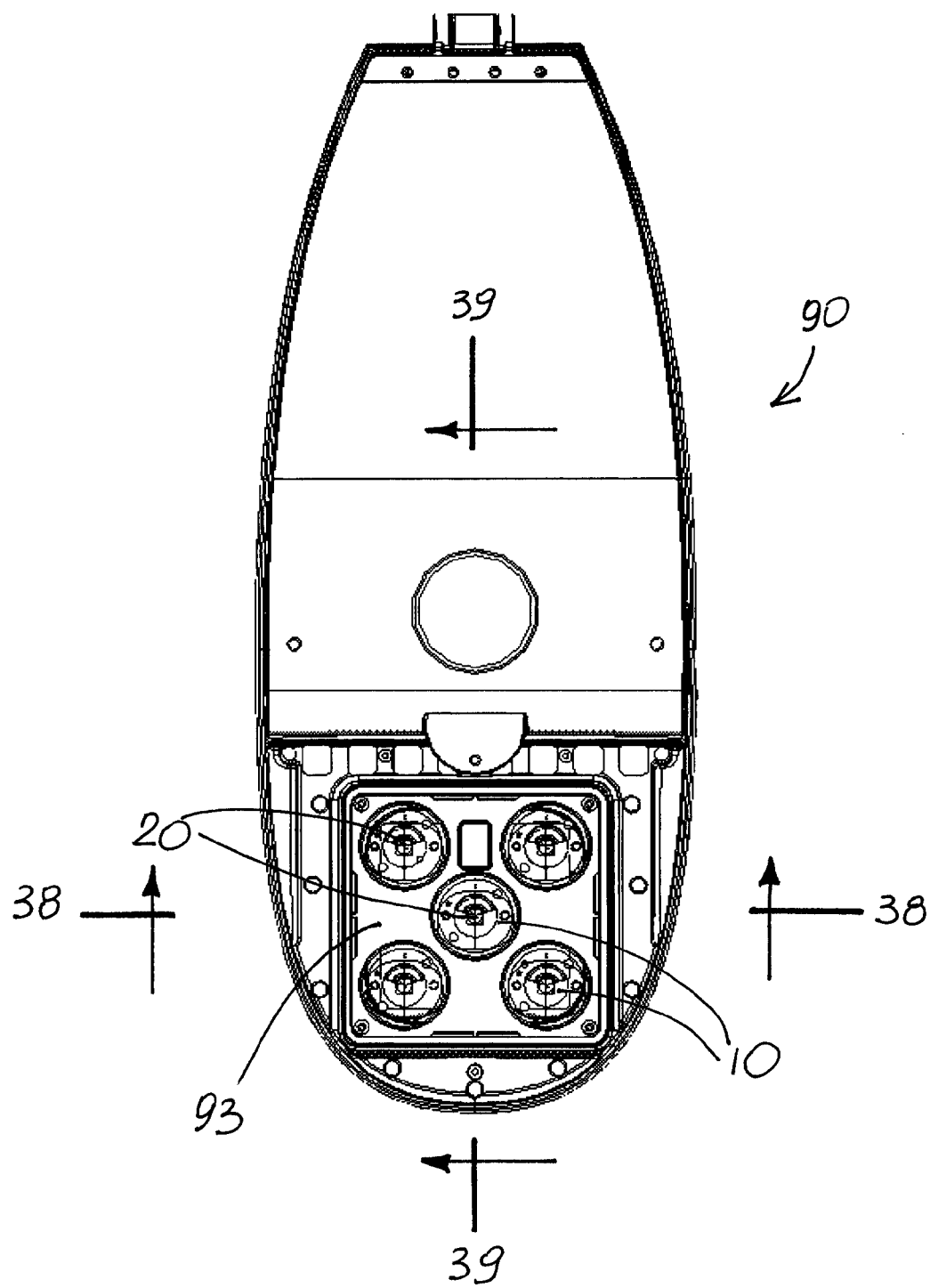
FIG. 37 is a plan view of the light fixture of FIG. 36.
Figure 38:
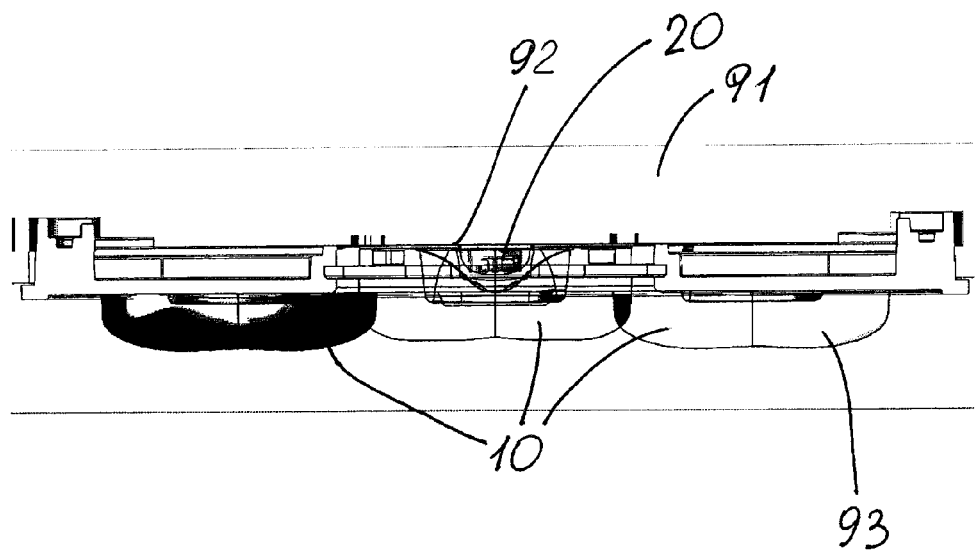
FIG. 38 is a fragmentary cross-sectional view of the light fixture of FIG. 36 taken along plane 38-38 shown on FIG. 37.

FIGS. 33-35 show lighting apparatus 80 which includes a plurality of lenses 10B according to the present invention. Lighting apparatus is configured for use with a plurality of LED light emitters spaced along a circuit board, each of the LED light emitters defining an axis, each lens 10B corresponding to one of the LED light emitters.

Lighting apparatus 80 may be a one-piece member which includes a plurality of lens portions interconnected by a single flange member, each of the lens portions including one of the plurality of lenses according to the present invention.

Alternatively, lighting apparatus 80 may be a one-piece optical member which has a polymeric carrier portion surrounding a plurality of lenses, each according to the present invention. Such carrier portion overlaps with and is molded onto the lens flanges across such overlapping. Such one-piece optical member and a method of manufacturing are described in detail in application Ser. No. 13/843,649, filed Mar. 15, 2013, the entire contents of which are incorporated herein by reference.

In fixtures utilizing a plurality of emitters, a plurality of LEDs or LED arrays may be disposed directly on a common submount in spaced relationship between the LEDs or LED arrays. This type of LED emitters is sometimes referred to as chip-on-board LEDs. In some other embodiments, each of LEDs is on a submount and each of the submounts is mounted on the circuit board. In some of such embodiments, each of the LEDs or LED arrays may be overmolded with a respective primary lens. In some examples, a lens according to the present invention may form the primary lens over a respective one of the LEDs or LED arrays. In some other examples, a plurality of inventive lenses form secondary lenses each over a respective one primary lenses. In some of such embodiments, the plurality of the inventive lenses may be molded as a single piece which my have a single flange surrounding each of the plurality of lenses 10B, as seen in FIGS. 33-35.

Figure 39:
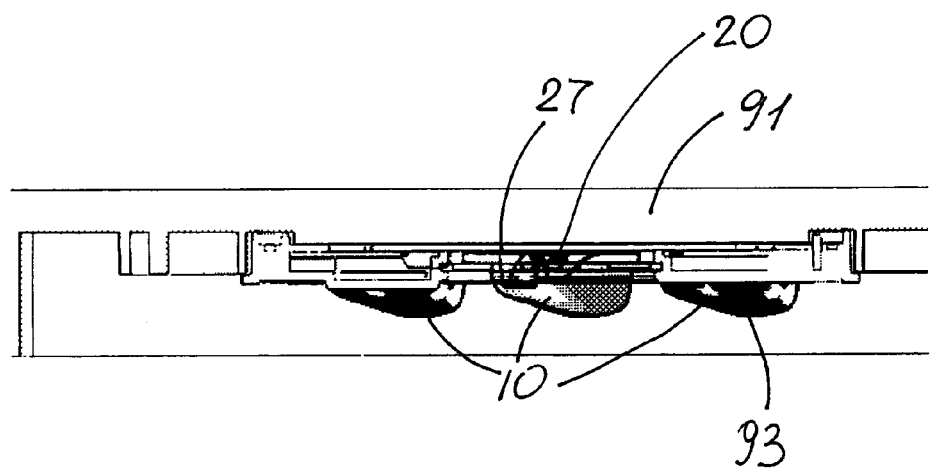
FIG. 39 is a fragmentary cross-sectional view of the light fixture of FIG. 36 taken along plane 39-39 shown on FIG. 37.

FIGS. 39-39 illustrate an example of a light fixture 90 incorporating the present invention. Fixture 90 includes a heat-sink structure 91 having a mounting surface 92 with a circuit board 27 on such mounting surface 92. Circuit board 27 supports a plurality of light emitters 20 spaced thereon. An optical member 93 is positioned over circuit board 27. Optical member 93 has a plurality of lenses 10 each in alignment with a corresponding one of emitters 20.

FIGS. 27-32 show light emitter 20 in the form of an LED package 23 which has a primary lens 24 over the at least one LED 22. In such embodiments, the inventive lens is a secondary lens placed over primary lens 24. Light emitter 20 may be of the type illustrated in FIGS. 29-31 which show LED package 23D with single LED 22 on a submount 26 and hemispheric primary lens 24D coaxially overmolded on submount 26 over LED 22.

Figure 27:
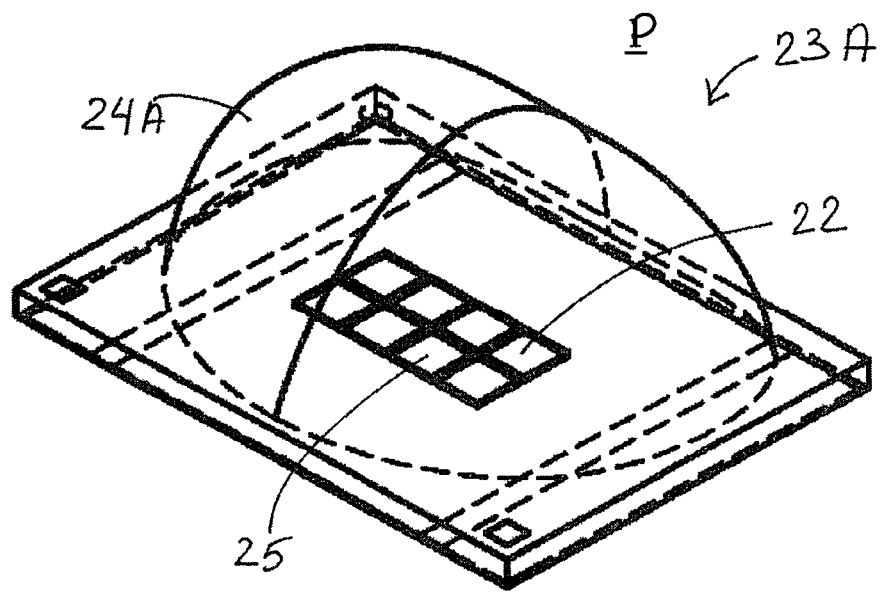
FIG. 27 is an enlarged perspective view of one example of an LED package and including an array of eight LEDs on a submount and an asymmetric primary lens overmolded over the LED array.
Figure 28:
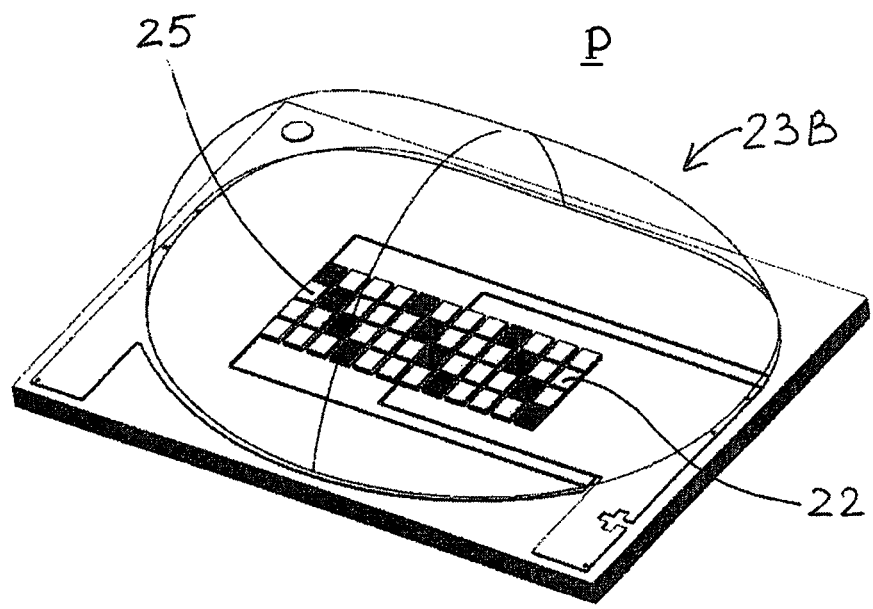
FIG. 28 is an enlarged perspective view of another example of an LED package and including an array of forty-eight LEDs on a submount and an asymmetric primary lens overmolded over the LED array.
Figure 29:
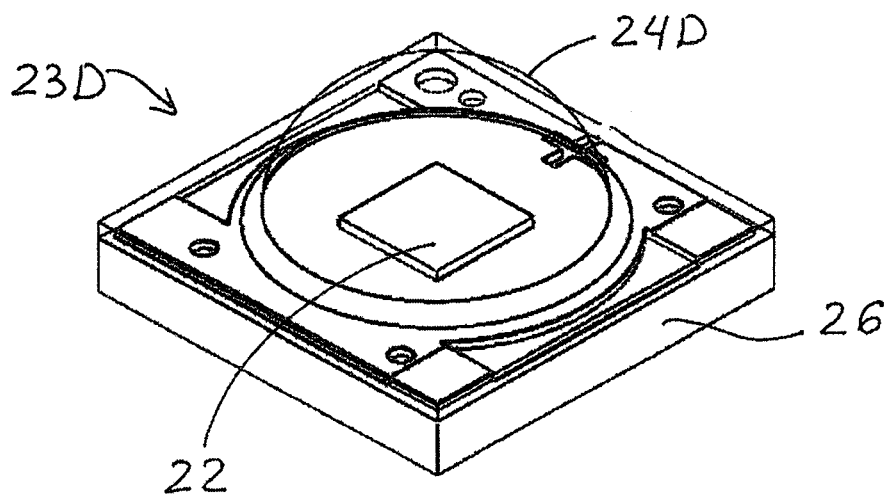
FIG. 29 is an enlarged perspective view of yet another example of an LED package which has a single LED on a submount with a hemispheric primary lens overmolded over the LED.
Figure 30:
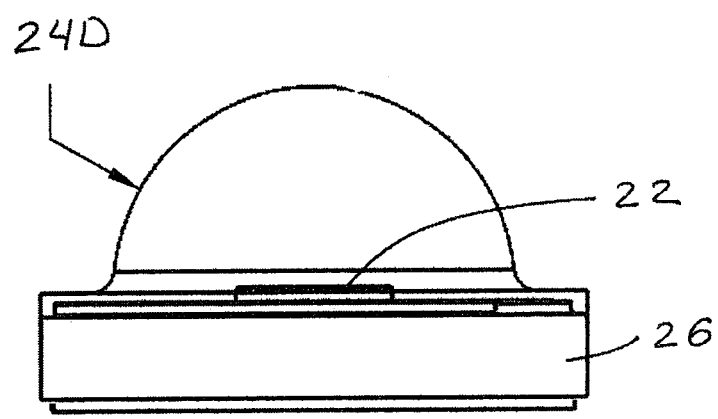
FIG. 30 is an enlarged side view of the LED package of FIG. 29.
Figure 31:
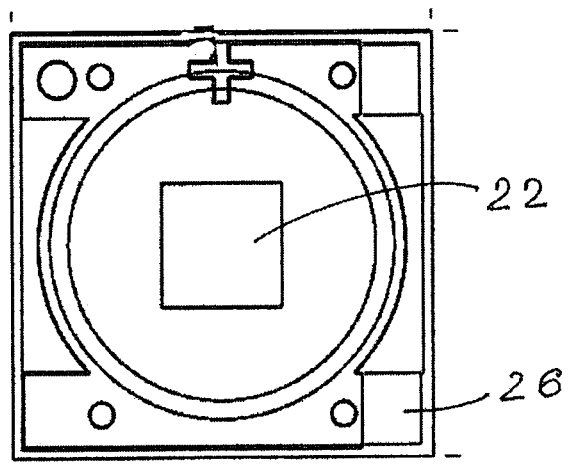
FIG. 31 is an enlarged top view of the LED package of FIG. 29.

FIGS. 27 and 28 illustrate exemplary LED packages 23A and 23B each including an array of LEDs 22 on an LED-populated area 25 which has an aspect ratio greater than 1, and primary lens 24 being overmolded on a submount 26 over LED-populated area 25. It is seen in FIG. 28 that the array may include LEDs 22 emitting different-wavelength light of different colors such as including red LEDs along with light green or other colors to achieve natural white light. Light emitters of the type as LED packages 23A and 23B are described in detail in application Ser. No. 13/441,558, filed on Apr. 6, 2012, and in application Ser. No. 13/441,620, filed on Apr. 6, 2012. The contents of both applications are incorporated herein by reference in their entirety.

Figure 32:
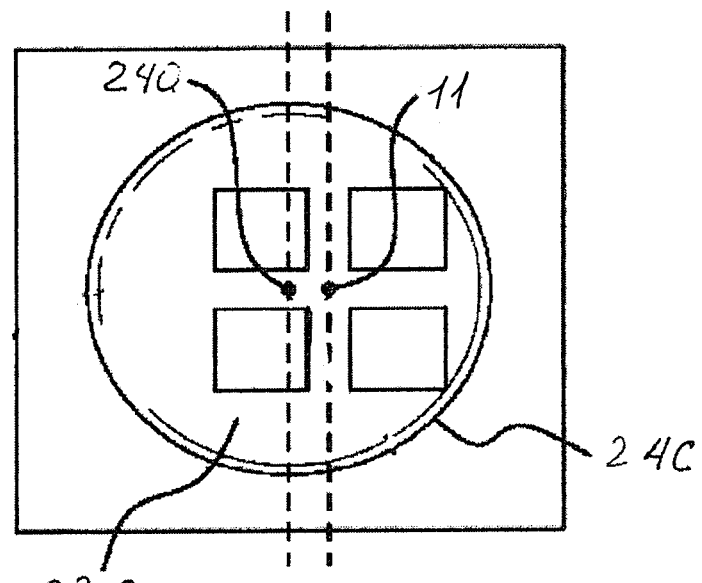
FIG. 32 is an enlarged top view of another exemplary LED package including an array of four LEDs on a submount and a hemispheric primary lens overmolded over the LED array such that the axis of the primary lens is offset from the axis of the LED array.

FIGS. 27, 28 and 32 illustrate versions of LED light emitter 20 configured to refract LED-emitted light in a forward direction (i.e., toward preferential side P). In each LED package 23A, 23B and 23C, each LED array defines an emitter axis. FIGS. 27 and 28 illustrate primary lens 24A configured to refract LED-emitted light forward. FIG. 32 shows hemispheric primary lens 24C having a centerline 240 offset from the emitter axis. It should be understood that for higher efficiency, LED emitter 20 may have a primary lens having both its centerline offset from the emitter axis and also being shaped for refraction of LED-emitted light toward preferential side P. In FIGS. 27 and 28, primary lens 24A is shown as asymmetric.

While the principles of this invention have been described in connection with specific embodiments, it should be understood clearly that these descriptions are made only by way of example and are not intended to limit the scope of the invention.

The invention claimed is:

1. A lens for distribution of light from a light emitter having an emitter axis, comprising:
    an inner surface defining an inner cavity about the emitter axis; and
    a total internal reflection (TIR) surface partially bounding a secondary cavity which is offset from the inner cavity with an intermediate surface therebetween, the intermediate surface including front and rear edges with a pair of side edges therebetween, the TIR surface extending from the rear edge of the intermediate surface the TIR surface and being centered substantially on a non-preferential side outwardly of and around the inner surface and positioned and configured for total internal reflection of light received from the inner surface toward a preferential side, the TIR surface comprising at least one recessed region extending away from the light emitter.

2. The lens of claim 1 wherein the TIR surface is substantially cross-sectionally convex.

3. The lens of claim 2 wherein the TIR surface comprises at least two cross-sectionally convex surface portions with the recessed region therebetween.

4. The lens of claim 3 wherein the recessed region is substantially cross-sectionally smoothly concave.

5. The lens of claim 4 wherein the recessed region smoothly adjoins adjacent convex portions of the TIR surface.

6. The lens of claim 1 wherein the recessed region is substantially cross-sectionally smoothly concave.

7. The lens of claim 6 wherein the recessed region smoothly adjoins adjacent convex portions of the TIR surface.

8. The lens of claim 1 wherein the inner surface is configured for distributing light from the light emitter predominantly toward the preferential side.

9. The lens of claim 8 wherein the TIR surface spans an angle in the range 90-180° around the emitter axis.

10. The lens of claim 9 wherein the TIR surface spans about 140° around the emitter axis.

11. The lens of claim 8 further comprising a base surface adjacent the emitter and forming an opening to an inner cavity about the emitter and a second opening to the secondary cavity partially bounded by the TIR surface.

12. The lens of claim 1 further including an outer surface configured for refracting emitter light predominantly toward the preferential side.

13. A lens for distribution of light from a light emitter having an emitter axis, comprising:
    an inner surface defining an inner cavity about the emitter axis;
    a total internal reflection (TIR) surface partially bounding a secondary cavity outwardly of and around the inner surface and positioned and configured for total internal reflection of light received from the inner surface, the TIR surface comprising at least one recessed region extending away from the light emitter; and
    an outer surface comprising a non-convex region substantially over the TIR surface and configured to further refract light received from the TIR surface.

14. The lens of claim 13 further comprising an outward flange extending from the outer surface away from the axis.

15. A lens for distribution of light from a light emitter having an emitter axis, comprising:
    an outer surface configured for refracting emitter light predominantly toward the preferential side;
    a total internal reflection (TIR) surface positioned outwardly of and around the emitter such that light received by the TIR surface is totally internally reflected toward the outer surface, the TIR surface comprising at least one recessed region extending away from the light emitter; and
    a non-convex region of the outer surface substantially over the TIR surface along the emitter axis and configured to further refract light received from the TIR surface.

16. The lens of claim 15 wherein the TIR surface is substantially cross-sectionally convex.

17. The lens of claim 16 wherein the TIR surface comprises at least two cross-sectionally convex surface portions with the recessed region therebetween.

18. The lens of claim 17 wherein the recessed region is substantially cross-sectionally smoothly concave and smoothly adjoins adjacent convex portions of the TIR surface.

19. The lens of claim 15 configured for distributing light from the light emitter predominantly toward a preferential side, the TIR surface being centered substantially on the non-preferential side to redirect light therefrom toward the preferential side.

20. The lens of claim 19 further including a refracting inner surface configured for refracting light from the light emitter predominantly toward a preferential side, the refracting inner surface having:
    a front sector centered on the preferential side and refracting emitter light predominantly toward the outer surface; and
    a back sector centered on the non-preferential side radially opposite the preferential side and having a back-sector surface configuration differing from the surface configuration of the front sector.

21. The lens of claim 20 wherein the TIR surface spans an angle in the range 90-180° around the emitter axis.

22. The lens of claim 21 wherein the TIR surface spans about 140° around the emitter axis.

23. The lens of claim 19
further comprising an inner surface defining an inner cavity about the emitter axis,
the TIR surface partially bounding a secondary cavity partially bounded by the TIR surface.

24. The lens of claim 23 wherein the secondary cavity is offset from the inner cavity with an intermediate surface therebetween, the intermediate surface including front and rear edges with a pair of side edges therebetween, the TIR surface extending from the rear edge of the intermediate surface.

25. The lens of claim 24 wherein the intermediate surface is substantially orthogonal to the emitter axis.

26. The lens of claim 24 wherein the rear edge of the intermediate surface is shaped by at least two convex edge portions each extending from the respective side edge toward a front-to-rear centerline and inwardly toward the emitter axis, thereby forming a recessed edge portion on the centerline.

27. The lens of claim 26 wherein the convex edge portions define two central tangent lines transverse to the centerline, the angle between the central tangent lines being less than 180°.

28. The lens of claim 27 wherein the convex edge portions define two side tangent lines transverse to the centerline, the angle between the side tangent lines being less than the angle between the central tangent lines.

29. The lens of claim 28 wherein the recessed edge portion is substantially smoothly concave and smoothly adjoins adjacent convex edge portions.

30. The lens of claim 24 wherein:
the TIR surface terminates remotely from the base surface at a distal edge of substantially continuous convex configuration; and
the secondary cavity is further partially bounded by an axially-remote surface extending from the base surface toward the TIR surface and offset therefrom by an end surface which extends from the distal edge of the TIR surface to an axially-remote surface.

31. The lens of claim 24 wherein the inner surface is configured for refracting light from the light emitter predominantly toward a preferential side, the inner surface including:
a front sector centered on the preferential side and having a first configuration for refracting light from the emitter predominantly toward the preferential side; and
a back sector centered on the non-preferential side radially opposite the preferential side and having a second configuration for refracting light from the emitter, the second configuration differing from the first configuration, the back sector extending from the front edge of the intermediate surface.

32. The lens of claim 31 wherein the intermediate surface portion is substantially orthogonal to the emitter axis.

33. The lens of claim 31 wherein the front edge of the intermediate surface is shaped by at least two convex front-edge portions each extending from the respective side edge toward a front-to-rear centerline and inwardly toward the emitter axis, thereby forming a recessed front-edge portion on the centerline.

34. The lens of claim 33 wherein the front edge of the intermediate surface is substantially equidistant from the rear edge at positions along radii from the emitter axis.

35. The lens of claim 15 further comprising a base surface adjacent the emitter and forming an opening to an inner cavity about the emitter and a second opening to a secondary cavity which is offset from the inner cavity and is partially bounded by the TIR surface.

36. The lens of claim 35 wherein the secondary cavity is further bounded by an axially-remote surface with an end surface adjoining the TIR surface and the axially-remote surface.

37. The lens of claim 15 further comprising an outward flange extending from the outer surface away from the axis.

38. A lens for distribution of light from a light emitter having an emitter axis, comprising:
an outer surface;
an inner surface defining an inner cavity about the emitter axis; and
a total internal reflection (TIR) surface partially bounding a secondary cavity which is offset from the inner cavity and centered substantially on a non-preferential side, the TIR surface being positioned outwardly of and around the emitter such that light received by the TIR surface is totally internally reflected toward a preferential side, the TIR surface comprising at least one recessed region extending away from the light emitter, the secondary cavity being offset from the inner cavity with an intermediate surface therebetween, the intermediate surface including front and rear edges with a pair of side edges therebetween,
the TIR surface extending from the rear edge of the intermediate surface, the rear edge of the intermediate surface being shaped by at least two convex edge portions each extending from the respective side edge toward a front-to-rear centerline and inwardly toward the emitter axis, thereby forming a recessed edge portion on the centerline.

39. The lens of claim 38 wherein the intermediate surface is substantially orthogonal to the emitter axis.

40. The lens of claim 38 wherein the recessed edge portion is substantially smoothly concave and smoothly adjoins adjacent convex edge portions.

41. The lens of claim 38 wherein the back sector of the inner surface extends from the front edge of the intermediate surface, the front edge of the intermediate surface is shaped by at least two convex front-edge portions each extending from the respective side edge toward a front-to-rear centerline and inwardly toward the emitter axis, thereby forming a recessed front-edge portion on the centerline.

42. The lens of claim 38 wherein the outer surface is configured for refracting emitter light predominantly toward the preferential side, the outer surface comprising a non-convex region substantially over the TIR surface configured to further refract light received from the TIR surface.

43. A light fixture comprising:
a heat-sink structure having a mounting surface;
a circuit board on the mounting surface and having a plurality of light emitters spaced thereon; and
an optical member over the circuit board and having a plurality of lenses each in alignment with a corresponding one of the emitters, each lens comprising an outer surface and a total internal reflection (TIR) surface positioned outwardly of and around the emitter such that light received by the TIR surface is totally internally reflected toward the outer surface, the TIR surface comprising at least one recessed region extending away from the light emitter, the outer surface being configured for refracting emitter light predominantly toward a preferential side and comprising a non-convex region which is substantially over the TIR surface along the emitter axis and is configured to refract light received from the TIR surface.

44. The light fixture of claim 43 wherein:

the TIR surface comprises at least two cross-sectionally convex surface portions with the recessed region therebetween; and the recessed region is substantially cross-sectionally smoothly concave and smoothly adjoins adjacent convex portions of the TIR surface.

45. A light fixture comprising:

a heat-sink structure having a mounting surface;

a circuit board on the mounting surface and having a plurality of light emitters spaced thereon;

an optical member over the circuit board and having a plurality of lenses each in alignment with a corresponding one of the emitters, each lens comprising an outer surface, a refracting inner surface and a total internal reflection (TIR) surface positioned outwardly of and around the refracting inner surface being configured for refracting light from the light emitter predominantly toward a preferential side, the refracting inner surface defining an inner cavity about the emitter axis, the TIR surface partially bounding a secondary cavity which is offset from the inner cavity and comprising at least one recessed region extending away from the light emitter.

46. The light fixture of claim 45 wherein:

the secondary cavity is offset from the inner cavity with an intermediate surface therebetween, the intermediate surface including front and rear edges with a pair of side edges therebetween;

the TIR surface extends from the rear edge of the intermediate surface, the rear edge of the intermediate surface being shaped by at least two convex edge portions each extending from the respective side edge toward a front-to-rear centerline and inwardly toward the emitter axis, thereby forming a recessed edge portion on the centerline; and a back sector of the inner surface extends from the front edge of the intermediate surface, the front edge of the intermediate surface is shaped by at least two convex front-edge portions each extending from the respective side edge toward a front-to-rear centerline and inwardly toward the emitter axis, thereby forming a recessed front-edge portion on the centerline.

47. The light fixture of claim 45 wherein the outer surface is configured for refracting emitter light predominantly toward the preferential side, the outer surface comprising a non-convex region substantially over the TIR surface configured to further refract light received from the TIR surface.

* * * * *

UNITED STATES PATENT AND TRADEMARK OFFICE
CERTIFICATE OF CORRECTION

PATENT NO. : 9,523,479 B2  Page 1 of 1
APPLICATION NO. : 14/147268
DATED : December 20, 2016
INVENTOR(S) : Corey Goldstein It is certified that error appears in the above-identified patent and that said Letters Patent is hereby corrected as shown below:

In the Claims

At Column 9, Claim 1, Line 46, insert --,-- after the word "surface."
At Column 9, Claim 1, Line 46, delete "and" after "the TIR surface."

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*